United States Patent [19]
Kakuishi et al.

[11] Patent Number: 5,367,540
[45] Date of Patent: Nov. 22, 1994

[54] TRANSVERSAL FILTER FOR USE IN A DIGITAL SUBSCRIBER LINE TRANSMISSION INTERFACE

[75] Inventors: Mitsuo Kakuishi; Seiji Mikyoshi; Hiroaki Itokawa; Nobukazu Koizumi; Yutaka Awata; Yuko Kurosaki, all of Kawasaki, Japan

[73] Assignee: Fujitsu Limited, Kawasaki, Japan

[21] Appl. No.: 4,895

[22] Filed: Jan. 19, 1993

[30] Foreign Application Priority Data

Jan. 16, 1992 [JP] Japan ................................. 4-006005
Jul. 21, 1992 [JP] Japan ................................. 4-193969

[51] Int. Cl.$^5$ .............................................. H04B 1/10
[52] U.S. Cl. ..................................... 375/103; 375/14; 364/724.16
[58] Field of Search ................... 375/101, 103, 14, 12, 375/96, 99; 364/724.1, 724.11, 726.16, 724.2

[56] References Cited

U.S. PATENT DOCUMENTS 5,124,705  6/1992  Voorman ......................... 375/28 X
5,126,961  6/1992  Garverick ........................ 364/724.1

OTHER PUBLICATIONS

Ma et al. "Polyphase IIR Decimation Filter Design for Oversampled A/D Converters at Approximately Linear Phase". IEEE Trans. on Circuits & Systems vol. 39 No. 8 Aug. 1992.
Park, "Multistage Decimation Filter Design Technique for High-Resolution Sigma-Delta A/D Converters" IEEE Trans. on Instrumentation & Measurement vol. 40 No. 6 Dec. 1992.
"Review and Analytical Comparison of Recursive and Nonrecursive Equalization Techniques for PAM Transmission Systems", Nicholas J. Lynch-Aird, IEEE, vol. 9, No. 6, Aug. 1991.

Primary Examiner—Stephen Chin
Assistant Examiner—Bryan Webster

[57] ABSTRACT

A transversal filter has a transfer function for which a zero point occurs outside a unit circle on z plane and thus the output waveform has a ringing characteristic having a change from negative to positive around a precursor and before a main cursor and is associated and integrated with another transversal filter, thereby forming a waveform shaping decimation filter or a pulse shaping high-pass filter. The waveform decimation filter can eliminate a high frequency noise, changes a high frequency input data to a low frequency output data, and performs a waveform shaping operation. Therefore it cannot require a pulse shaping filter separated from the decimation filter. The pulse shaping high-pass filter includes a pulse shaping filter whose number of the taps is decreased and performs high-pass filter function. A pulse shaping filter whose number of the taps is decreased can be used separately from the high-pass filter.

17 Claims, 30 Drawing Sheets

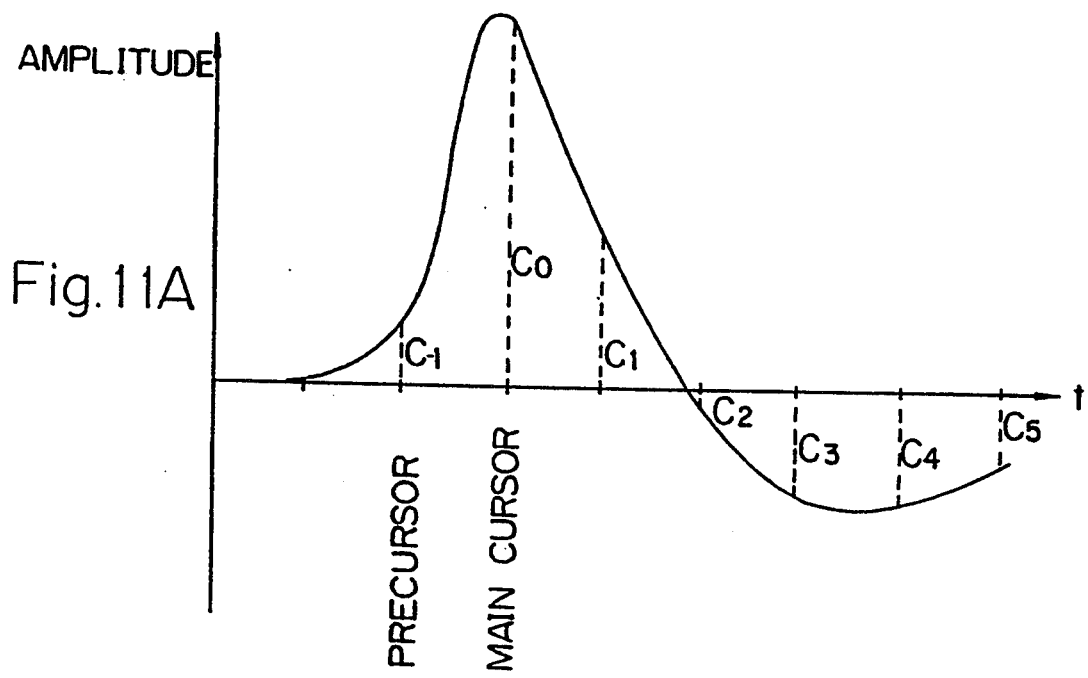
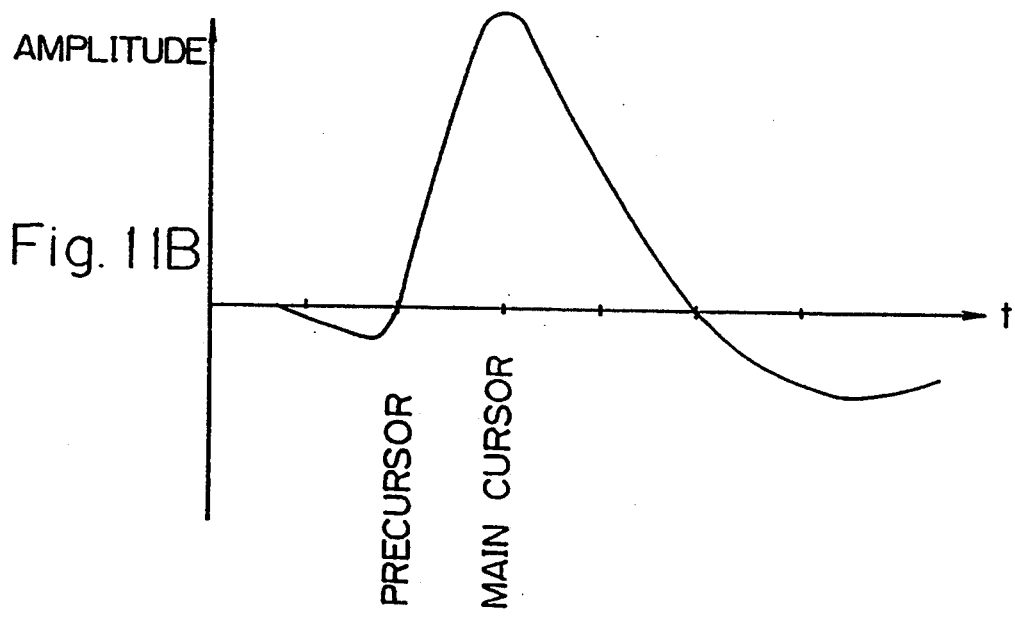

TRANSVERSAL FILTER FOR USE IN A DIGITAL SUBSCRIBER LINE TRANSMISSION INTERFACE

BACKGROUND OF THE INVENTION

1. Field of the Invention

The present invention relates to a transversal filter used in processing a received signal in a digital subscriber line interface apparatus (ISDN interface transceiver) for transmitting high-speed digital data in a transmitting and a receiving direction alternatively or simultaneously by using a metallic pair cable which forms an existing telephone subscriber line, and more specifically to a decimation filter for removing high frequency noise from digital data converted at a frequency much higher than the basic sampling frequency and at a lower precision than required, and for converting the result to high precision digital data at a speed lower than one or two times the speed at the basic sampling frequency and to a pulse shaping filter for shaping an isolated pulse response by shaping the waveform of a received signal so that a sampling timing of the data can be controlled.

2. Description of the Related Art

In order to make a digital communication network such as an ISDN used widely, a digital subscriber line transmission system has been developed for transmitting high-speed digital data by using existing metallic cable which is currently being used for transmission of a voice band signal. In this case, it is necessary to properly deal with inter-symbol interference distortion caused by variations in transmission loss due to a difference in distance between subscriber lines, limitations of pass band and reflection by bridge taps (BT) with an open end which exists in an existing subscriber line. As a transmission system, a ping-pong transmission system for alternatively performing transmission and reception in a time divisional manner and an echo-canceler system for performing transmission and reception simultaneously by using a hybrid circuit and an echo-canceler have been developed.

An over-sampling A/D converter has been used for receiving a signal in a digital subscriber line transmission interface device for simultaneously or alternately transmitting high speed digital data in two-way (sending/receiving) directions using metallic pair cables, that is, existing telephone subscriber lines.

The above described high speed digital subscriber line transmission interface device transmits a four-value amplitude code represented by values ±1 and ±3, for example, at a transmission speed of 80 Kilobaud.

A signal attenuated and distorted in its waveform by the loss characteristics of metallic pair cables is digitized by an A/D converter for receiving a signal from a corresponding unit so that a digital process can correct the attenuation and the deformation in its waveform.

Furthermore, the relation between the size of hardware and the conversion precision of the A/D converter has required that an over-sampling A/D converter be used in a unit for transmitting 4-value codes at a transmission speed of about 80 Kilobaud.

An over-sampling A/D converter converts data to a digital signal more coarse than required precision at a sampling frequency much higher than a basic sampling frequency depending on baud rate frequency of a signal. The resultant signal is passed through a low-pass digital filter so that high frequency noise can be removed from the signal and then the signal can be converted to high-precision digital data at a speed lower than one or two times the speed at the basic sampling frequency. This filter is commonly referred to as a decimation filter.

Normally, a decimation filter used in the above described conventional digital subscriber line transmission interface device can be a transversal filter with a transfer function (representing input data/output data) indicated by the following equation (1). The characteristics of the stop bands of the filter is that of a comb type filter in which the peaks of the loss characteristics are concentrated on m zero points occurring at equal intervals. The characteristic of the passing bands of this filter is that the loss is increases as the frequency gets higher, Therefore, a pulse shaping filter is required in the stage following this filter if the pulse waveform is to be flat or controlled at request.

$$H(z^{-1}) = \left(\frac{1 - z^{-n/z}}{1 - z^{-1}}\right)m \tag{1}$$

where $z = \exp(j2\pi f/(nf_s))$, $m = 2$ or $3$, $n$ indicates an over-sampling ratio, $f_s$ indicates the basic sampling frequency, and $f$ indicates the frequency of a signal.

To adjust the timing of a received signal, a first precursor indicating an isolated pulse response characteristic of a received signal is used.

To use the first precursor in adjusting the timing as described above, the first precursor is positioned at the point where the sign of the isolated pulse response characteristic turns from negative to positive. Furthermore, it is desirable to maintain a post-cursor small enough to reduce the burden on the decision feedback equalizer in the following stage. The pulse shaping filter is used to determine a precursor and a post-cursor such that the isolated pulse response characteristic indicates the desired form.

Normally, a high-pass filter fop removing direct current components is provided in the stage following the pulse shaping filter. Since the filter can be operated at the basic sampling frequency, it is implemented by a digital signal processor together with the functions of the decision feedback equalizer, etc.

As shown in FIG. 1, the input part of the conventional digital subscriber line transmission interface device comprises a $\Delta\Sigma$ converter 1 in the over-sampling A/D converter, a decimation filter 2, a pulse shaping filter 3, and circuits 4 such as an echo-canceler, etc.

A received signal is applied to the $\Delta\Sigma$ converter 1 through a simple low-pass filter not shown in FIG. 1. The received signal is converted by the $\Delta\Sigma$ converter 1 to a 1-bit digital signal at an over-sampling frequency of 15.36 MHz, for example. These high speed data are converted to low-speed multi-bit data by the decimation filter 2 having the transfer function shown by equation (1). However, the speed is not as low as the baud rate because the filter should be operated at a frequency higher than double the baud rate to form a waveform of a precursor portion, etc. with the required precision. That is, the decimation filter 2 outputs data at least at double the baud rate and the basic sampling frequency of 80 KHz in the digital subscriber line transmission interface device, that is, at 160 KHz. A practical example of equation (1) is shown by the following equation (2).

$$H1(z^{-1}) = \left(\frac{1-z^{96}}{1-z^{-1}}\right)^3 \quad (2)$$

where $z = \exp(j2\pi f/15360)$

Since the numerator in equation (2) contains the term $(1-z^{-1})$, equation (2) is a function without a denominator, indicating a transversal filter with 286 taps as shown by equation (3). 286 is the result of the expression $(96-1) \times 3 + 1$.

$$H1(z^{-1}) = \sum_{i=0}^{285} b_i z^{-1} \quad (3)$$

where $z = \exp(j2\pi f/15360)$ $b_i$: tap coefficient

The zeros are triply overlapping and occur at equal intervals on the z plane as shown in FIG. 2 except the portion near the point where z=1.

On the other hand, the pulse shaping filter is a transversal filter with 6 to 8 taps operating at the frequency of double the baud rate. The output can be obtained at the baud rate, that is, 80 KHz.

The transfer function of the pulse shaping filter is obtained by the following equation (4), for example.

$$H2(z^{-1}) = a_0 + a_1 z^{-1} + a_2 z^{-2} + a_3 z^{-3} + a_4 z^{-4} + a_5 z^{-5} + a_6 z^{-6} + a_7 z^{-7} \quad (4)$$

where $z = \exp(j2\pi f/160)$ where $a_0$ through $a_7$ are tap coefficients of a transversal filter.

FIG. 3 shows the loss frequency characteristics of the low-frequency portion of a filter composed of a conventional decimation filter and a conventional pulse shaping filter. The loss at 30–40 KHz is larger than that at DC. That is, there is a small gain at 30–40 KHz, and a frequency over 60 KHz ensures a stop frequency band at which the data does not pass through the filter due to the loss. Macroscopically, the higher the frequency is, the larger the attenuation becomes, gibing a maximum value around 7.68 MHz though not shown in FIG. 3.

The peak attenuation at intervals of 160 KHz shown in FIG. 3 is caused by the zero point of the decimation filter, and the other peaks are obtained by the zero points of the pulse shaping filter. The attenuation obtained at the peak at intervals of 160 KHz is larger than that obtained at any other point because the zero points of the decimation filter are triply overlapping.

Although a triply-overlapping zero point results in a locally large attenuation, the attenuation at the frequencies between two zero points is small. Therefore, it is not totally efficient from the view point of the reduction of noise, which is the object of a decimation filter. To reduce noise down to the level below a predetermined value, the scale, that is, the order, of the filter should be large enough.

FIG. 4 shows the configuration of a conventional decimation filter. Since the output of the $\Delta\Sigma$ converter 1 is represented by a value $\pm 1$, the calculation according to equation (3) is replaced with an addition or a subtraction of a tap coefficient. Besides, as an input signal is applied to the decimation filter at a frequency of 15.36 MHz, it is very difficult to repeat additions or subtractions without limit. Therefore, three adders are necessary according to the calculation 285/(15360/160)=2.97 to obtain an output at 160 KHz. Accordingly, the operation of equation (2) can be divided into three steps as indicated in the following equation (5).

$$H1(z^{-1}) = \sum_{i=0}^{95} b_i z^{-1} + \sum_{i=96}^{191} b_i z^{-1} + \sum_{i=192}^{207} b_i z^{-1} \quad (5)$$

where $b\,286 = b\,287 = 0$

Each of the terms in equation (5) is executed by different hardware. FIG. 4 shows the hardware of a decimation filter. The operation of the first term of equation (5) is executed by the first stage S1 shown in FIG. 4, and the result of the operation is transmitted to register R2. Then, the operation of the second term of equation (5) is executed by the second stage S2 of the central part shown in FIG. 4. Likewise, the result of the operation is transmitted to register R3, and the remaining operation is executed by the rightmost third state S3 in the circuit with the result outputted as the decimation filter.

ROM M1 through ROM M3 in the circuit shown in FIG. 4 store tap coefficients which are read and added by selectors S1 through S3 respectively after being inverted (subtraction) or maintained as is (addition). The scale of the circuit is about 1,700 gates.

The decimation filter shown in FIG. 4 is explained in detail. ROM M1, selector S1, adder A1, and register R1 form a module for calculating the first term of equation (5). ROM M2, selector S2, adder A2, and register R2 form a module for calculating the second term of equation (5). ROM M3, selector S3, adder A3, and register R3 form a module for calculating the third term of equation (5).

Equation (5) is expressed in terms of $Z^{-1}$, and the actual process is performed such that signal data Xi inputted at 15.36 MHz are multiplied by filter coefficients bi, and 288 such products are obtained and summed to form the output of the filter. Since the actual input is $+1$ or $-1$, a sum of products can be calculated by an adder. If an adder performs an addition in every cycle at 15.36 MHz, only 96 additions can be performed in the time period corresponding to 160 KHz. Therefore, three adders must be provided in parallel to obtain an output at 160 KHz. This is the reason why the calculation of the filter is divided into three terms. The first term of equation (5) performs an addition for the portion containing filter coefficients 0 through 95, the second term of equation (5) performs an addition for the portion containing filter coefficients 96 through 191, and the third term of equation (5) performs an addition for the portion containing filter coefficients 192 through 287.

In FIG. 4, ROM M1 stores filter coefficients 0 through 95, ROM M2 stores filter coefficients 96 through 191, and ROM M3 stores filter coefficients 192 through 287. If an input signal Xi is positive, a coefficient from a ROM is applied as is to an adder, and it is applied after being inverted if Xi is negative. The sum is fed back to the input part of the adder, and the addition is repeated 96 times.

Normally, selectors S4 and S5 apply the output of register R2 to adder A2 and apply the output of register R3 to adder A3. However, at every 96th cycle, selectors S4 and S5 apply the output of register R1 to adder A2 and the output of register R2 to adder A3. Likewise, the output of register R3 is outputted as the output of the filter. In this cycle, the route from register R1 to adder A1 is omitted, and adder A1 starts its addition at zero.

As a result, the contents of register R2 are obtained by adding the sum of the second term to that of the first term, and the contents of register R3 are obtained by adding the sum of the third term to those of the first and second terms. The sum of the 96th addition of register R3 indicates the result of the arithmetic operation according to equation (5). FIG. 5 shows the time chart of these operations.

FIG. 6 shows the configuration of the circuit of a conventional pulse shaping filter. It is a transversal filter, but different from the configuration shown in FIG. 4 in that the input signal of the pulse shaping filter (the output of the decimation filter) is composed of 18-bit 160 KHz data, not a 1-bit input as in the case of the decimation filter. The tap coefficients $a_0$ through $a_7$ of this filter require a precision of about 10 bits, and the operation of equation (4) is performed as a sum-of-products operation. Since a multiplier must be provided to obtain a product and the hardware scale of the multiplier has to be large, an output can be obtained in the circuit shown in FIG. 6 by storing 256 sorts of output data in the ROMs if each piece of input data comprises one bit, and by repeating additions 18 times by shifting by one bit the output corresponding to a digit of input data if each piece of the input data comprises 18 bits. The input of the pulse shaping filter is applied at 160 KHz, the output is obtained at 80 KHz, and one added is used for multiple uses. The scale of the circuit of the filter is indicated by 1500 gates not including ROMs.

The pulse shaping filter shown in FIG. 6 is used for performing the arithmetic operation of equation (4). The following equation can be obtained by rewriting equation (4) by using an input data series Xi (i=0, 1, ..., 7).

$$OUT\ 2 = \sum_{i=0}^{7} (a_i X_i)$$

if Xi is a binary occupying 14 bits, it can be represented by the following equation.

$$X_i = \sum_{j=0}^{13} (b_{ij} \cdot 2^{-j})$$

Xi can be substituted in the above equation.

$$OUT\ 2 = \sum_{i=0}^{7} \left( a_i \sum_{j=0}^{15} (b_{ij} \cdot 2^{-j}) \right)$$

$$OUT\ 2 = \sum_{j=0}^{13} \left( \sum_{i=0}^{7} (a_i b_{ij}) 2^{-j} \right)$$

$$= \sum_{j=0}^{13} (C_{iJ} \cdot 2^{-j}).\ となる。$$

where $$C_{iJ} = \sum_{i=0}^{7} (a_i b_{ij}).\ である。$$

Since bij is 0 or 1, the Cij can be one of $2^8 = 256$ values when an 8-tap transversal filter is used. The Cij corresponding to each sample of an input signal string can be sequentially outputted to an adder by storing 256 values in ROMs end reading Cij from ROM MA4 with bit data comprising 8-digit input signal data as an address.

In FIG. 6, eight consecutive signal data are stored in registers RA1 through RA8. For example, input data are provided to an address in ROM MA4 at 160 KHz sequentially from a lower order bit in each register. Thus, a corresponding Cij is outputted.

Next, a sum should be obtained after multiplying Cij by $2^{-j}$. For example, if data are processed starting from the lower order bit, then the output in register RA0 containing a sum is shifted towards the low-order side by one bit and a Cij corresponding to the next bit is added, Since the output of the filter is the sum of number-of-digits times of additions, the result is outputted after changing the direction of a selector.

Assuming that the frequency of the output is 80 KHz and that of the input is 160 KHz, the above described process is performed once at 80 KHz by shifting input data twice.

FIG. 7 is a coefficient map of a conventional filter comprising a conventional decimation filter and a pulse shaping filter, indicating the impulse response.

FIGS. 8 and 9 show the isolated pulse response characteristic of an output waveform when a signal pulse is applied after being transmitted through the long cable with 7.5 Km length and when the cable length is zero in the case where a filter comprises a conventional decimation filter and a pulse shaping filter as shown in FIG. 6.

The isolated pulse response characteristic indicated when a signal is applied after being transmitted through the long cable is obtained through a high-pass filter in response to the output of a pulse shaping filter. That is, the characteristic is obtained as a result of the process $1-D$.

On the other hand, the isolated pulse response characteristic indicated when the cable length is zero is obtained after the process $1/(1-0.875D)$ in addition to the process $1-D$, where $D=z^{-1}=\exp(-j2\pi f/80)$ and f indicates a frequency (KHz). Since a filter coefficient can be represented by 4 bits at maximum, the filter processes $(1-D)$ or $(1-D)/(1-0.875D)$ cause no problems in performing processes in a digital signal processing circuit having no multipliers in the following stages.

Since a conventional decimation filter aims at reducing high-frequency noise, its impulse response is that of a normal low-pass filter, and indicates a main response, exclusively as shown in FIG. 10. As the characteristics shown in FIG. 10 indicate no ringing before a main response, a precursor cannot be used to adjust timing.

The hardware containing a decimation filter followed by a pulse shaping filter in an over-sampling A/D converter of a conventional digital subscriber line transmission interface device requires a large scale circuit involving a total of about 3200 gates.

A digital signal processing circuit in the following stage for operating a high-pass filter, an echo-canceler, a decision feedback equalizer, etc. must be operated at a high speed of 15.36 MHz. However, it cannot involve a process in a decimation filter, nor in a pulse shaping filter because no adders are provided. If a multiplexer is provided, a pulse shaping filter can be operated, but requires 3000 or more gates for the circuit of a multiplexer. Thus, the scale of the circuit is required to be considerably large.

Therefore, a decimation filter and a pulse shaping filter must be realized as exclusive circuits, thereby preventing from being realized the reduction of the scale of the entire hardware and of the power consumption. Accordingly, small scale of decimation filter and pulse shaping filter circuits have been requested.

FIG. 11A shows an isolated pulse response of a transmission line up to the input of the decision feedback equalizer 4 when pulse shaping filter 3 is not provided. FIG. 11B shows a characteristic obtained by inserting the pulse shaping filter 3 and in and the characteristic of change from the negative to positive in the region around the precursor preceding the main cursor by 1 sampling period, the isolated pulse response amplitude being at its maximum at the main cursor. Then, a timing controller delays the sample timing when the precursor value $C_1$ calculated at the decision feedback equalizer 4 is negative and advances the sample timing when the precursor value $C_1$ is positive. A clock controlled by the timing controller is input to respective units as the operation clock.

A transversal filter with 7 to 9 taps is used for pulse shaping and it is considered that an operation with a frequency twice or three times the symbol frequency is required to perform pulse shaping completely. This is because control of the amplitude of a received signal only at every symbol period is not sufficient to perform pulse shaping completely and thus control of the amplitude of the received signal is considered to be performed at the middle point of the symbol period or at three points obtained by equally dividing the symbol period.

Therefore it is conventionally necessary that the frequency of the output of the decimation filter 2 is twice or three times the symbol frequency. The decimation filter 2 obtains the digital value with multiple bits by deleting a high frequency component of the signal obtained by performing 1 bit quantization at a high frequency which is 200 times the symbol frequency and thus should operate at a frequency near 200 times the symbol frequency and thus comprises a large scale transversal filter with 300 taps.

Therefore the decimation filter is formed of dedicated hardware. Generally speaking, the scale of hardware of the digital transversal filter has a strong relationship with the product of the frequency of the input data, the frequency of the output data and the number of taps. The greater the product becomes the larger the scale is. Accordingly the fact that the repetition frequency of the output data from the decimation filter 2 is twice or three times the symbol frequency makes it difficult to decrease the scale of the decimation filter. A higher repetition frequency of the output data of the decimation filter requires a higher operation of the filter and makes multiple use of the hardware difficult, thereby substantially increasing the scale of the circuit as well as the power consumption.

SUMMARY OF THE INVENTION

An object of the present invention is to provide a transversal filter circuit for a digital subscriber line interface apparatus with a smaller scale and a lower power consumption.

Another object of the present invention is to provide a transversal filter provided in a receiving side of a digital subscriber line interface, and including a decimation filter of an over-sampling A/D converter for reducing the scale of the circuit of a decimation filter and a pulse shaping filter.

A further object of the present invention is to provide a transversal filter provided in a digital subscriber line interface and including a pulse shaping filter with a simpler structure or a pulse shaping high-pass filter with a pulse shaping function and a high-pass function for decreasing the number of taps of an echo-canceler.

A first feature of the present invention resides in a transversal filter for use in a receiving part of a digital subscriber line interface device comprising a decimation filter unit for eliminating noise from a received signal by converting a frequency of the received signal, a pulse shaping filter unit having tap coefficients corresponding to a transfer function in which at least one 0 point is provided outside a unit circle in the z plane and having an impulse response having a ringing characteristic in which the inverted polarity of the main response is added to the main response, a high-pass filter unit for receiving the output of the pulse shaping filter unit and for passing a high frequency signal, and unit for providing the pulse shaping filter unit and one of the decimation filter unit and the high-pass filter unit as same unit.

A second feature of the present invention resides in a transversal filter wherein the decimation filter and pulse shaping filter comprises a transversal decimation filter in an over-sampling A/D converter for receiving a signal comprising a small number of bits at a speed of n times a basic sampling frequency, removing high frequency noise components, generating a waveform, eliminating unnecessary components, and outputting a signal at a speed of the basic sampling frequency, wherein a coefficient of each transversal tap is determined such that one or two zero points associated with the characteristic of pass areas are located near the point where $Z=1$ on the z plane, and that at least one of the zero points of a transfer function is positioned outside a unit circle of the z plane, and an impulse response characteristic is featured by a wave formed with a polarity reversed to a main response before the issue of the main response.

A third feature of the present invention resides in a transversal filter wherein the pulse shaping filter comprises a pulse shaping filter wherein it has an isolated pulse response in which the polarity of the input signal is inverted near the time preceding the maximum value of that response waveform by period T when the isolated pulse response is considered up to an input of an inter-symbol interference compensator provided in a receiving side of the transmission line for transmitting a multi-value level signal at a predetermined symbol period T and the transfer function H(z) by the z conversion is expressed as follows.

$$H(z)=1-az^{-1}, \text{ where } a>1$$

A fourth-feature of the present invention resides in a transversal filter wherein the pulse shaping filter and high-pass filter comprises a waveform shaping high-pass filter comprising unit for inverting the polarity of an input signal at a time preceding the time of the maximum value of the waveform of the isolated response by period T when the isolated waveform is considered up to the input of an inter-signal interference compensator provided at the receiving side of the transmission line for transmitting a multi-value level signal at a predetermined symbol period T, and a unit for passing only a high frequency component of the output from the first unit, wherein the transfer function H(z) expressed by the z conversion is as follows.

$$H(z)=1/(1-a)+z^{-1}-a/(1-a)\cdot z^{-2}$$

where a>1

BRIEF DESCRIPTION OF THE DRAWINGS

FIG. 11A and 11B show views for explaining the pulse shaping formation;

DESCRIPTION OF THE PREFERRED EMBODIMENTS

First, a receiving part of a digital subscriber interface device in which the present invention is used will be explained.

Figure 12:
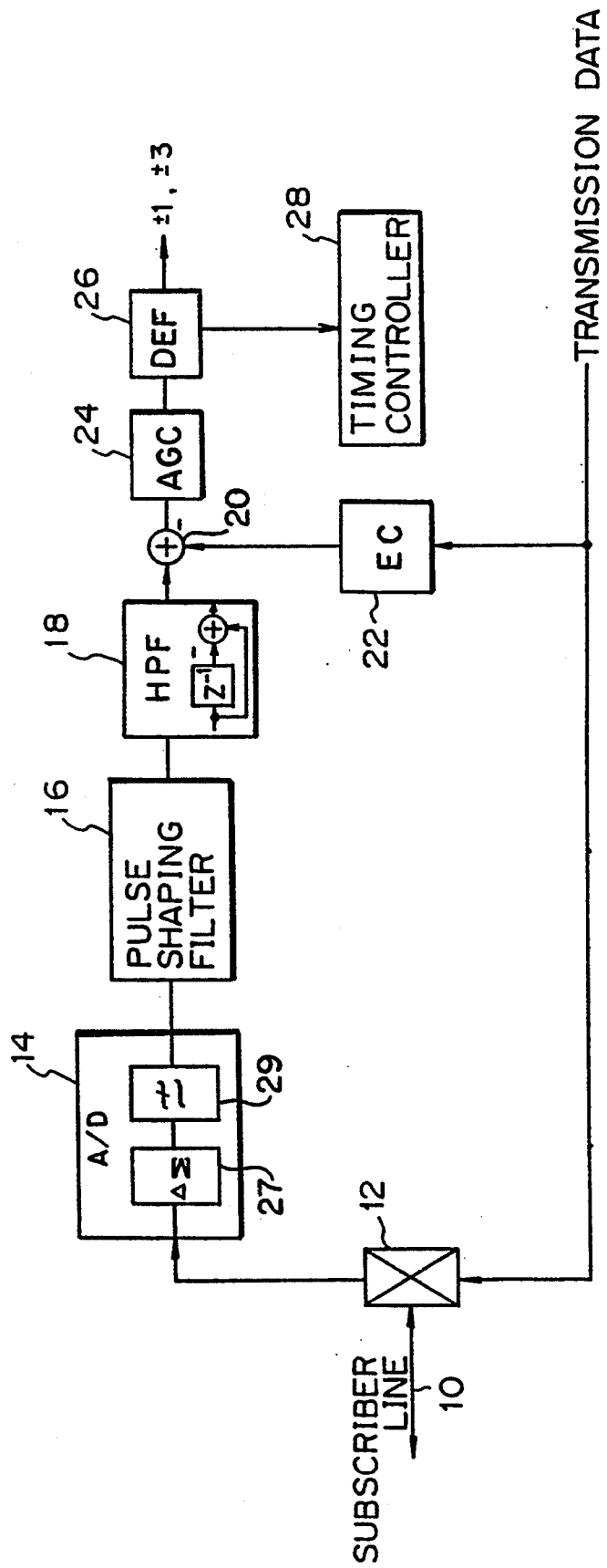
FIG. 12 shows a block diagram of a digital subscriber line transmission interface apparatus in which the transversal filter according to the present invention is used.

FIG. 12 shows a block diagram of a digital subscriber line interface apparatus in which an echo-canceler system is adopted. In FIG. 12, the reception signal received through subscriber line 10 is converted to a digital signal by an over-sampling A/D converter 14 through hybrid circuit 12 for 2-wire to 4-wire conversion. The output of over-sampling A/D converter 14 is provided through pulse shaping filter 16 and high-pass filter 18 to subtracter 20 in which a replica echo produced from echo-canceler 22 is subtracted from the received data and thus the loop-back component of the transmission signal at the hybrid circuit 12 is removed. AGC circuit 24 corrects the attenuation characteristic of a transmission line and then decision feedback equalizer(DFE) 26 removes the inter-symbol interference distortion and determines four values such as ±1 and ±3 for outputs. Some of the coefficients calculated by the decision feedback equalizer 26 are utilized for timing control in timing controller 28. The over-sampling A/D converter 14 comprises a cascade connection of ΔΣ converter 27 and decimation filter 29.

Pulse shaping filter 16 will be described later. High-pass filter 18 is provided to decrease the number of taps of echo-canceler 22, thereby simplifying the circuit. As the impedance characteristic of a transmission line viewed from the hybrid circuit 12 is not ideal, the transmission signal is looped back into the receiving side at the hybrid circuit 12, thereby producing an echo. An echo-canceler 22 is provided to remove the echo-component, and the number of taps which form an index representing the scale of the echo-canceler 22 is determined by the duration of the period of the isolated pulse response of the echo. The hybrid circuit 12 in the digital subscriber line interface apparatus comprises a hybrid transformer or a 2-wire to 4-wire converter similar to the hybrid transformer which is equivalent to a high-pass filter having a cutoff frequency of less than several hundred Hz. Thus the isolated pulse response of the echo represents a waveform which attenuates at a very low rate. Therefore, a large scale of echo-canceler with 100 to 200 taps is required for a symbol frequency of 80 kHz. Therefore, the low frequency component is removed by a high-pass filter 18 with a higher cutoff frequency, thereby quickly attenuating the echo and thus the number of taps of the echo-canceler is decreased to 20 to 30. The high-pass filter 18 has a simple construction with a transfer function $(1-z^{-1})$ representing the difference between samples which are separated from each other by 1 sampling period, as shown in FIG. 12.

Figure 13:
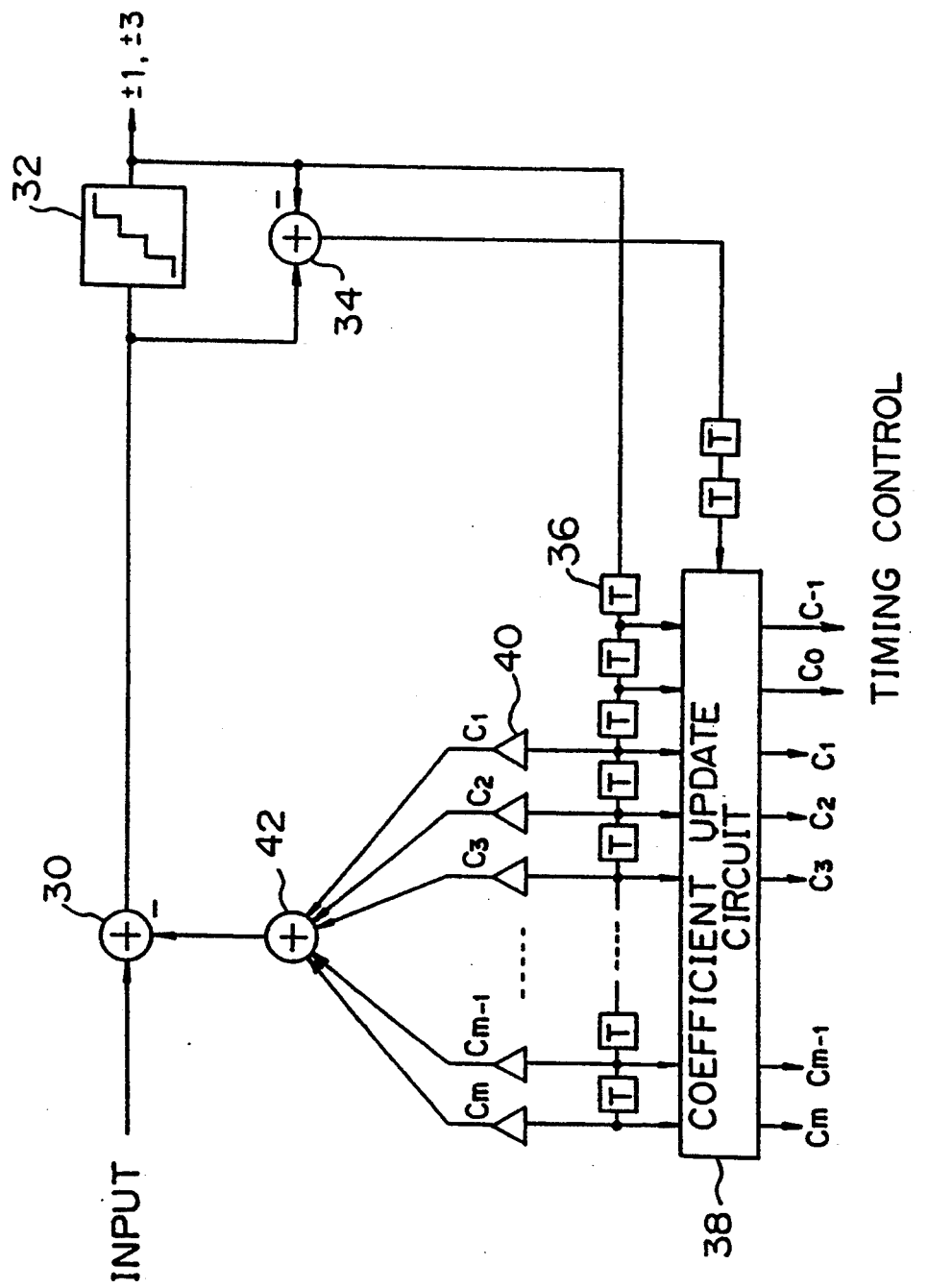
FIG. 13 shows a block diagram of a configuration of a decision feedback equalizer used in the block diagram shown in FIG. 12.

Decision feedback equalizer 26 has a structure as shown in FIG. 13. A decision unit 32 determines the output of subtracter 30 to output data ±1 and ±3 as the decision result and subtracter 34 detects the difference between the data before the decision and after the decision, thereby determining a decision error. A coefficient update circuit 38 calculates coefficients $C_{-1}, C_0, C_1, \ldots C_m$ based on the decision error and a signal obtained by delaying the decision result using a cascade connection of a plurality of delay units 36 with a delay time T corresponding to a single symbol. The multiplier 40 with coefficient $C_1, \ldots C_m$ (post-cursor values) multiplies the delayed signals of the decision result and adder 42 adds the outputs of multiplier 40 to provide a feedback signal. The subtracter 30 subtracts the feedback signal from the input signal to provide the input to the decision unit 32. The coefficient update circuit 38 uses a well-known LMS (least mean square) algorithm, for example, for an calculation of coefficients.

When the coefficients $C_{-1}, C_0, C_1, \ldots C_m$ converge in the coefficient update circuit 38, they correspond to the sample values of the isolated pulse response of the transmission line up to the input of the decision feedback equalizer 26. The post-cursor values $C_1, \ldots C_m$ chosen out of the coefficients $C_{-1}, C_0, C_1, \ldots C_m$ are multiplied with the delayed signal of the decision result to prevent an inter-symbol interference distortion from being sent forwards and the subtracter 30 removes the inter-symbol interference distortion. The coefficients $C_{-1}$, and $C_0$ are respectively called a precursor value and a main cursor value. The times corresponding to them are respectively called a precursor and a main cursor. The precursor value $C_{-1}$ is used for timing control in the timing controller 28 as described later.

A first embodiment of the present invention relates to a transversal decimation filter for receiving a signal consisting of a small number of bits at a speed of n times a basic sampling frequency, removing high frequency noise components, generating a waveform, and outputting a signal at the speed of the basic sampling frequency. A coefficient of each transversal tap is determined such that one or two zero points of a transfer function associated with the characteristics of pass band are located near the point where Z=1 on the z plane, and that at least one of the zero points of a transfer function is positioned outside the unit circle of the z plane.

The isolated pulse response characteristic is featured providing by a ringing waveform with a polarity reversed to an main response before the issue of the main response by setting each of the transversal taps as described above. Then, single zero points (which are not overlapped) associated with stop bands are positioned at equal intervals on the circumference of the unit circle of the z plane. Thus, the same attenuation can be retained with the increase of the orders held to lower than twice as compared with the conventional decimation filter.

Figure 14:
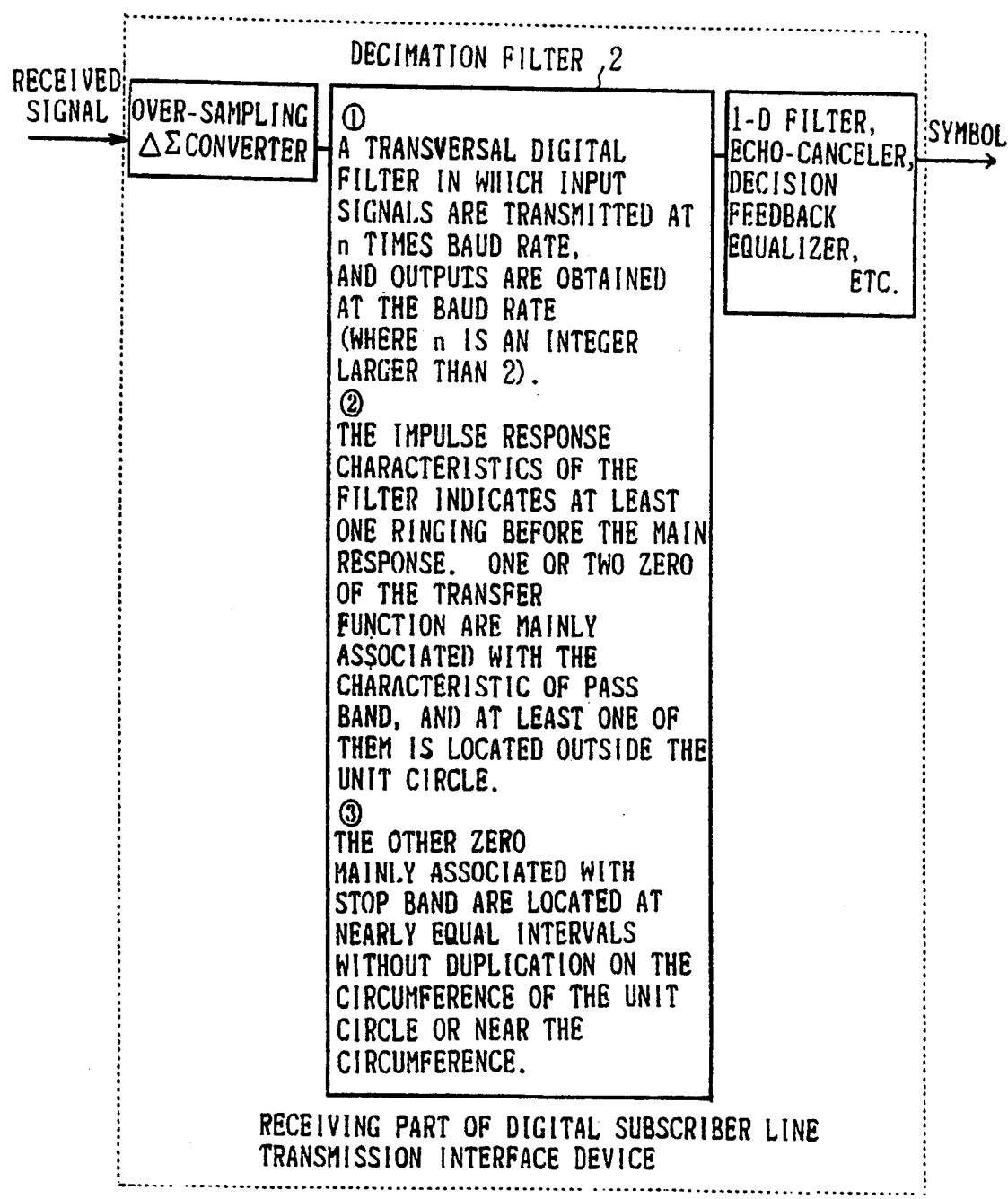
FIG. 14 shows the basic configuration of an embodiment of the present invention.

FIG. 14 shows the basic configuration of an embodiment of the present invention. A decimation filter is positioned in the central part and shapes a waveform. It comprises a transversal filter as in a conventional decimation filter.

The decimation filter of the present invention is designed such that an impulse response, that is, a tap coefficient map becomes negative for a moment before a main response and that high frequency components are blocked, thereby representing smooth curve of a frequency response. That is, the decimation filter is assigned the function as a pulse shaping filter. The decimation filter of the present invention has an order of double the order of a conventional decimation filter. However, since it is operated at a ½ speed of the conventional filter, the necessary scale of the hardware is the same as that of the conventional decimation filter.

The decimation filter and a pulse shaping filter are combined using their functions. A product can be calculated as follows in consideration of the difference in $z^{-1}$ between equations (3) and (4).

$$H3(z^{-1}) = \sum_{i=0}^{957} C_i z^{-i} \tag{6}$$

where, $Z^{-1} = \exp(j2\pi f/15360)$
$C_i$: tap coefficient

Figure 4:
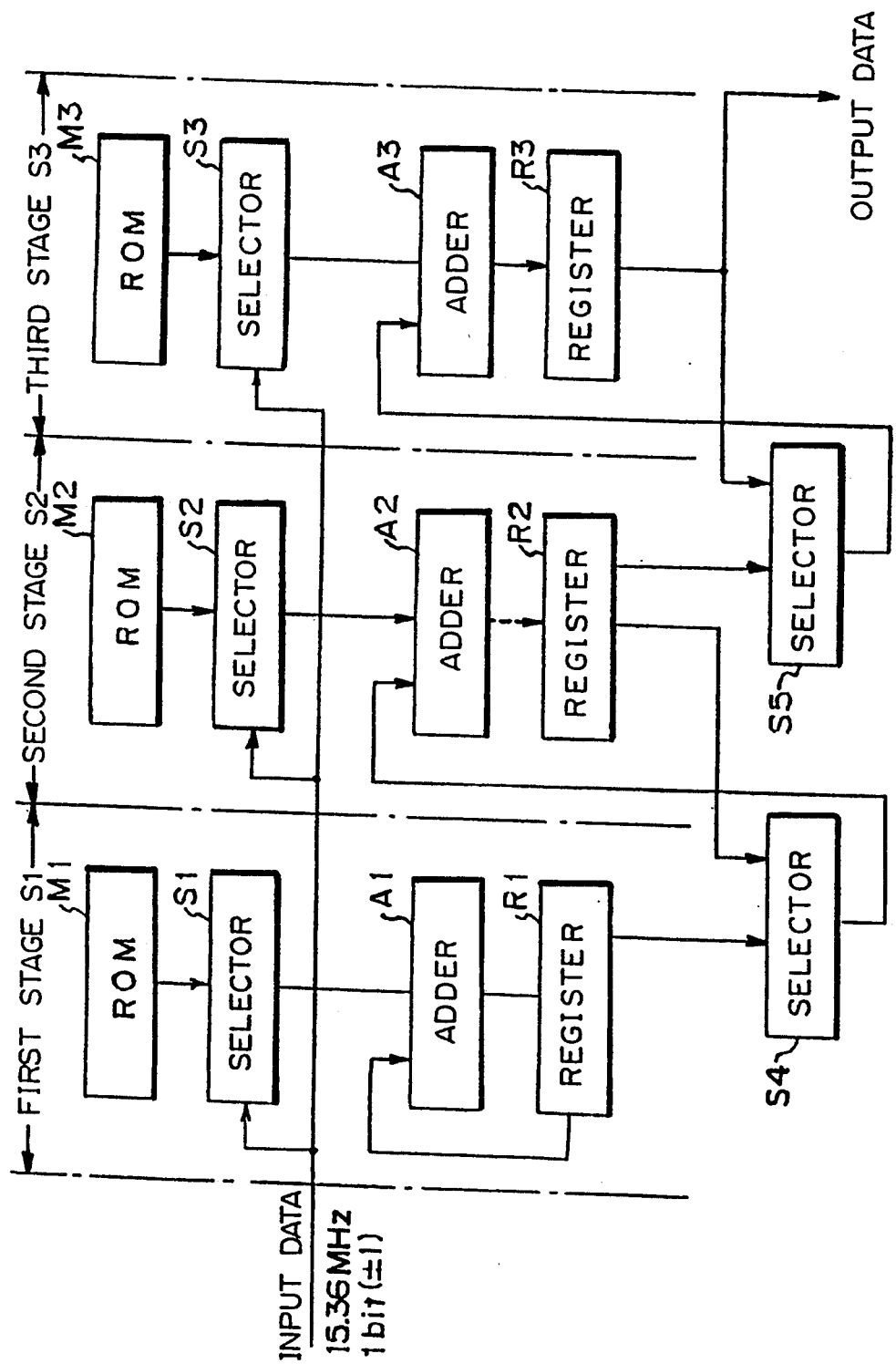
FIG. 4 shows the hardware configuration of the decimation filter.
Figure 5:
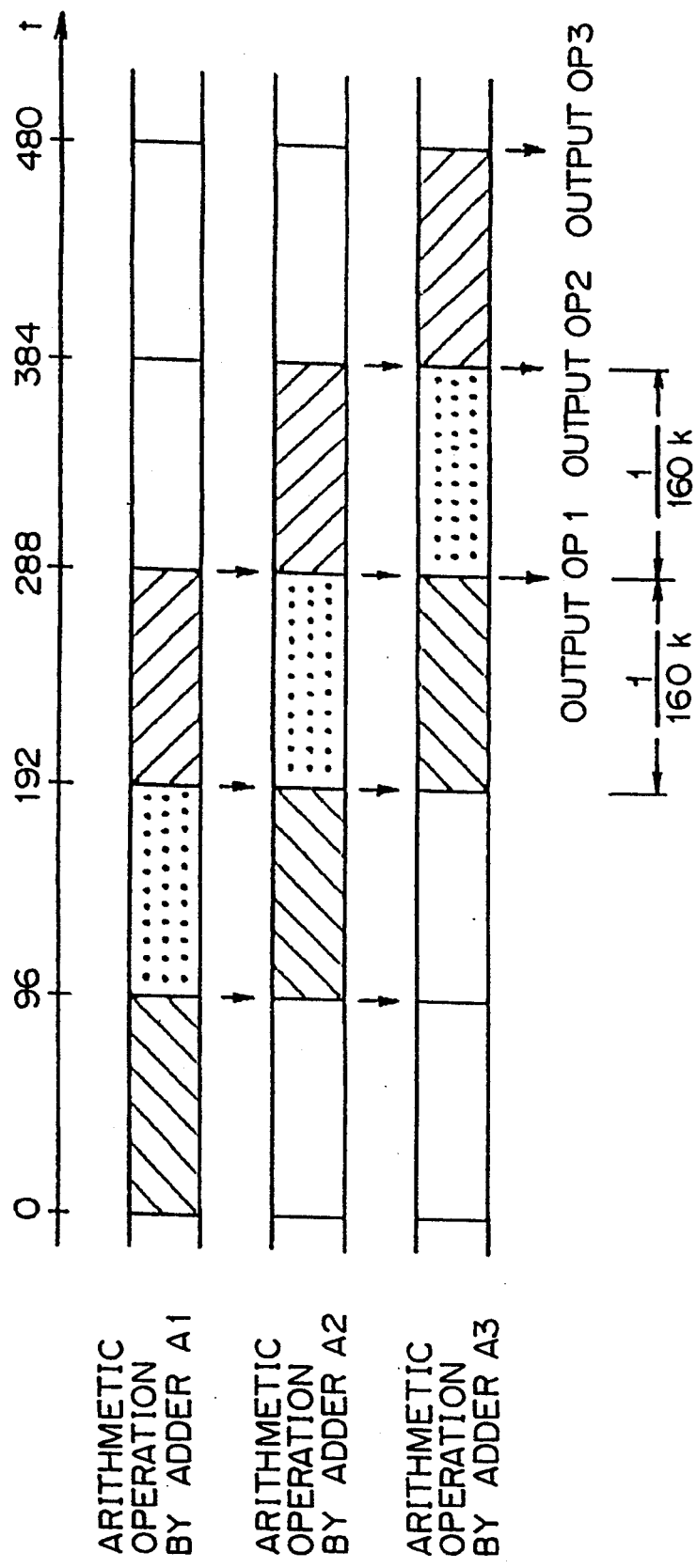
FIG. 5 is a timing chart of the decimation filter.
Figure 6:
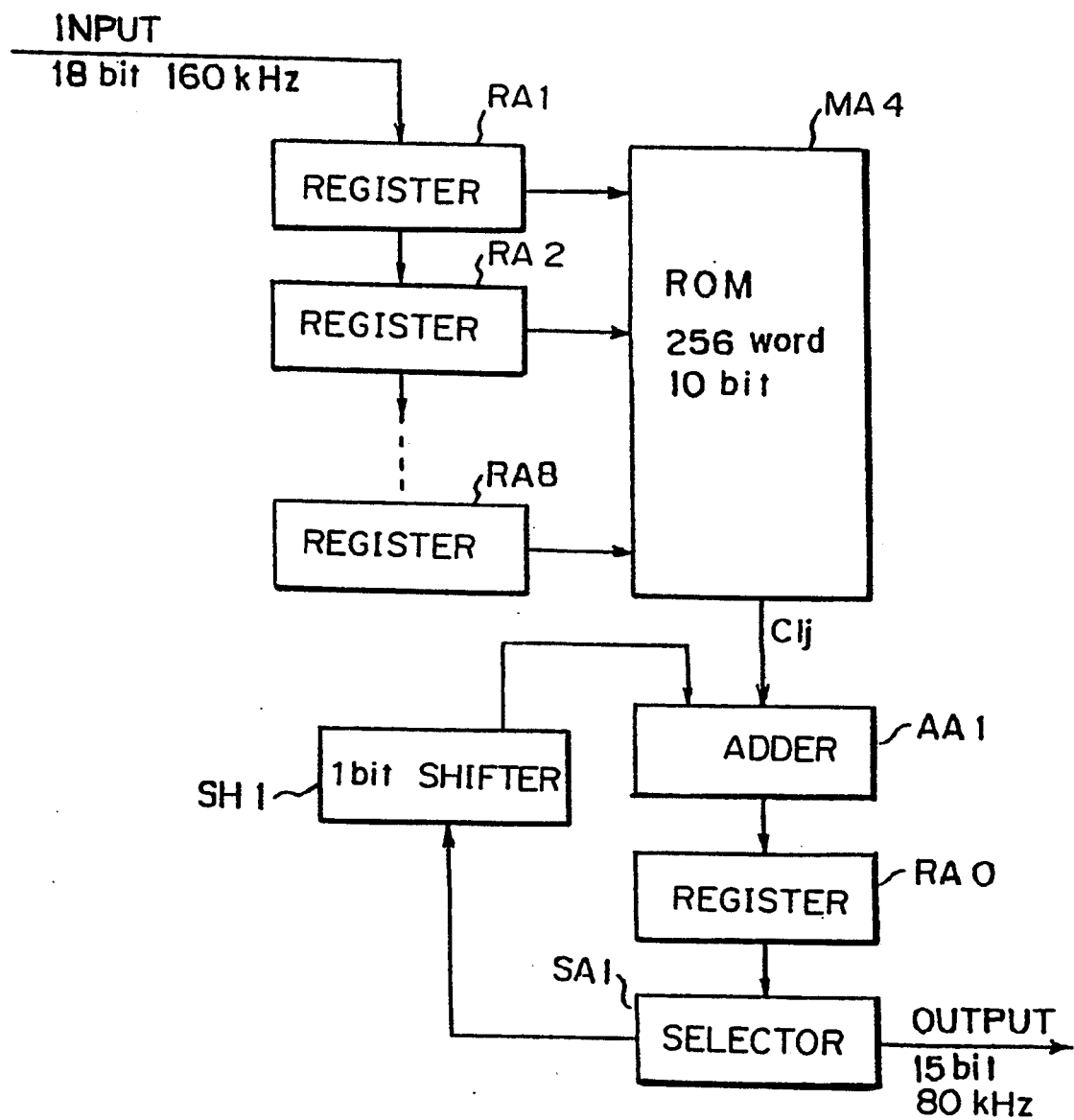
FIG. 6 shows the configuration of the conventional pulse shaping filter.

It indicates a transversal filter with 957 taps operating at 15.36 MHz. Since the output is obtained at 80 KHz in this case, the necessary number of adders can be calculated by the equation 957/(15360/80)=4.98. Accordingly, five adders are required. That is, as 5/3 times the circuit shown in FIG. 4 is established, it involves about 2830 gates. Therefore, it is smaller than the circuit involving 3200 gates. However, the scale of the ROM storing tap coefficients necessarily becomes large.

Figure 7:
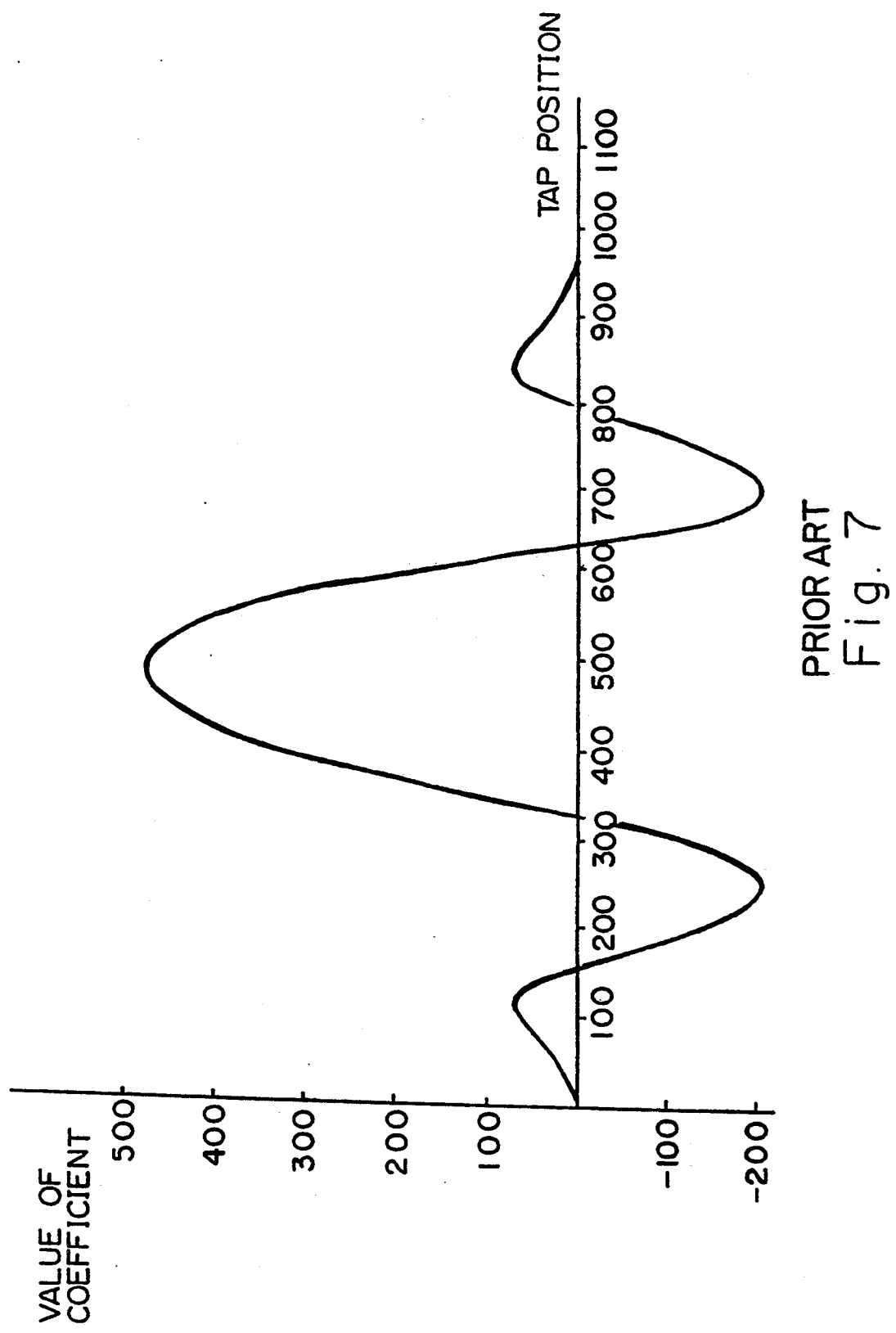
FIG. 7 shows the coefficient map (impulse response) of the conventional filter comprising a decimation filter and a pulse shaping filter.
Figure 16:
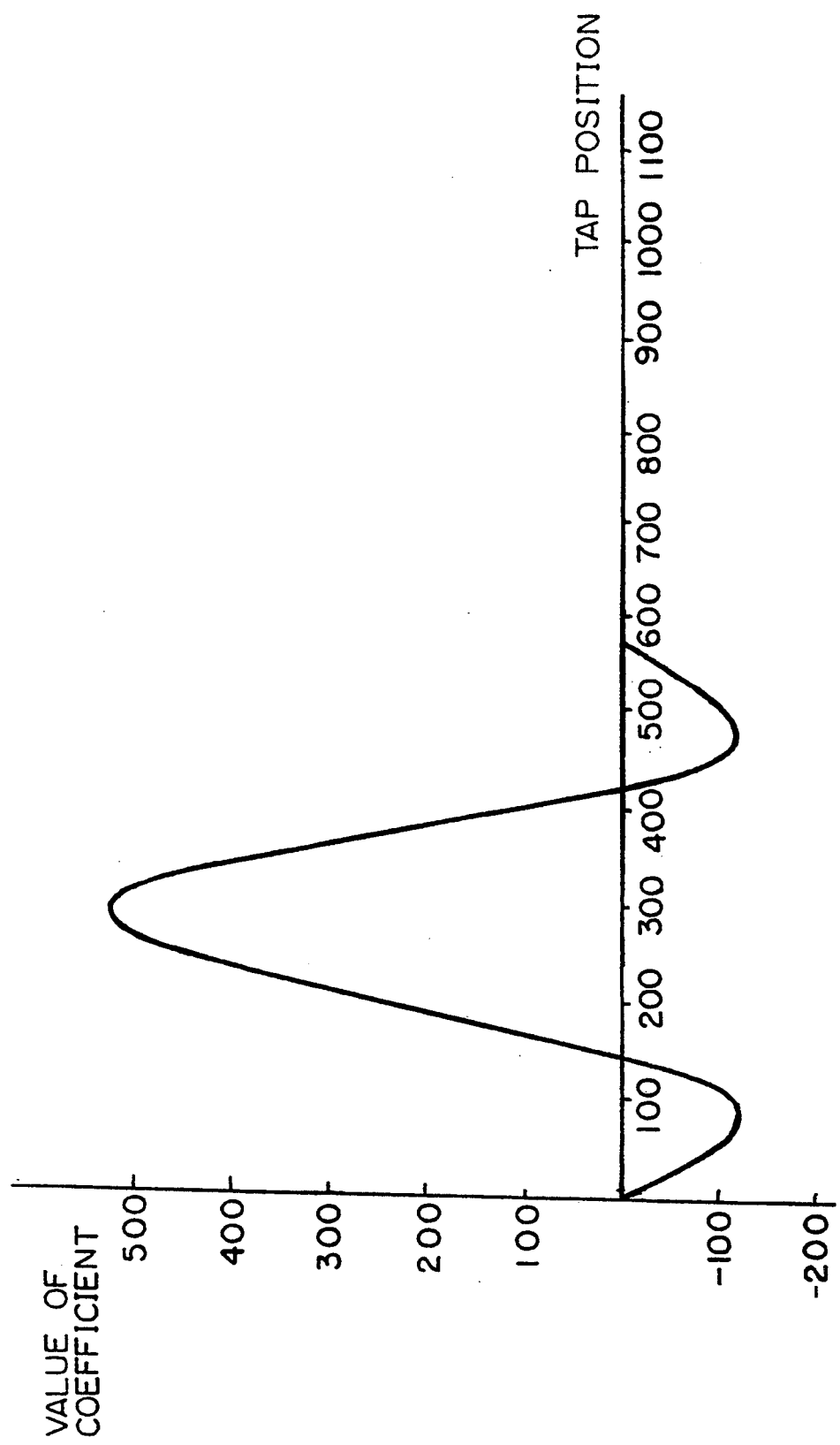
FIG. 16 shows the coefficient map (impulse response) of the decimation filter having one zero point outside a unit circle according to the present invention.

The impulse response characteristics in this case are the same as those shown in FIG. 7. The tap coefficient map represented as a graph shows the values of tap coefficients of a transversal filter in which the values are sequentially shown in the graph starting from the input side. As well known, the map corresponds to the impulse response. The impulse response of the coefficient map shown in FIG. 16 has two ringings before and after the main response separately. The inner ringing shows a ringing characteristic showing a form similar to those of the ringing characteristic shown in FIGS. 8 and 9.

The simple combination of the conventional decimation filter and the pulse shaping filter as described above cannot successfully reduce the scale of a circuit. The present invention controls the amplitude characteristic and the phase characteristic of pass band as explained in 1, 2, and 3 below so that the decimation filter operating at an over-sampling frequency has the function of shaping a waveform in addition to removing high frequency components.

1. As for the transfer function of a filter, the duplicate of zero points is eliminated at a stop band. For example, non-duplicate zero points are positioned at equal intervals from around the basic sampling frequency to the over-sampling frequency. Thus, predetermined attenuation can be retained with the increase of the degree held to lower than twice.

2. The characteristics of pass band are determined in consideration of impulse responses. That is, the isolated pulse response characteristic is determined to indicate a negative value for a moment before marking the peak. Since the isolated pulse response characteristic mostly corresponds to the impulse response, the impulse response of a filter peak so as to indicate a negative value for a moment. To make the impulse response indicate a negative value before its peak, one or two zero points of a filter transfer function associated mainly with the characteristic of the points near the pass band are positioned on the real axis on the z plane, and at least one of the two zero points is positioned outside the unit circle. Thus, the isolated pulse response waveform obtained at the output of the filter can be generated such that it rises after indicating a negative value for a moment.

3. Apart from 2 above, two zero points of a filter transfer function associated mainly with the loss characteristic near the pass band are positioned as a conjugate complex root near the point where $z=1$ on the z plane, and the two zero points are positioned outside the unit circle. Thus, the isolated pulse response waveform obtained-at the output of the filter can be Generated such that it rises after indicating a negative value for a moment. Furthermore, the amplitude at the second precursor, that is, at the time before the first precursor point (at which the waveform turns from negative to positive) by the time period for a baud rate, can be maintained exactly at zero.

This is explained further in detail below. Generally, an impulse response of a low-pass filter in a minimum phase shift circuit indicates no ringings before a main response. A momentary negative turn before the maximum amplitude value of an impulse response unit an occurrence of a ringing before a main response, which proves that the filter is not associated with the minimum phase shift circuit at all.

Accordingly, to allow the first precursor portion of an isolated pulse response characteristic to turn to a negative value for a moment before a main response, it is assumed that the transfer function of a filter is not associated with a minimum phase shift circuit. That is, at least one zero point of a transfer function is set outside a unit circle. As for the transfer function of a conventional decimation filter, no zero points associated mainly with the characteristics of pass band are positioned. By contrast, in the present invention, one or two zero points mainly associated with the characteristics of pass band are positioned, and at least one of them is positioned outside a unit circle so as to maintain a decimation filter not associated with a minimum phase shift circuit.

The reason why the hardware can be reduced if a zero of the transfer function occurs outside the unit circle is as follows. The amplitude of the waveform can be formed such that it cleanses from negative to positive around the precursor in the isolated pulse response characteristic of the decimation filter by providing a zero point of the transfer function of the decimation filter outside the unit circle. The conventional decimation filter does not have a ripple before the main cursor of the isolated pulse response and is formed of a simple low-pass filter. In contrast the isolated pulse response of the filter having a transfer function with a zero point outside the unit circle can change the amplitude from negative to positive as it has a ripple before the main cursor. The pulse shaping filter provided at the postceding stage is for providing a ripple before the main cursor. As the decimation filter in the present invention has the function of pulse shaping the waveform, the present invention does not need the pulse shaping filter. The pulse shaping filter is not required, thereby decreasing the circuit necessary for the pulse shaping filter and thus reducing the hardware volume, In addition, the scale of the decimation filter in the present invention is not increased.

As explained above, the order of the decimation filter itself increases in spite of elimination of the pulse shaping filter if the function (3) of the original decimation filter is simply multiplied by the function (4) of the pulse shaping filter and thus the circuit scale is not reduced. If the decimation filter is integrated with the pulse shaping filter in a simple manner, a transversal filter with 757 taps is necessary when it is considered that the output may be at 80 Khz. Thus the number of the adders becomes 5 although it is 3 in the conventional system and the number of gates increases in spite of the elimination of the pulse shaping filter and thus the reduction of the circuit is not particularly effective as a whole. In the conventional filter, stop band region characteristic arranges triple zero points at equal intervals. Thus the loss is sufficient at certain frequency intervals but the loss tend to decrease at intermediate frequencies between two frequency intervals. The present invention arranges a single zero point at equal intervals instead of triple zero points and thus can obtain uniform loss at all frequencies. The present invention can achieve a large attenuation with regard to a filter with a low order and thus can decrease the order of the decimation filter.

The order of the decimation filter can be suppressed to 576 which is twice that of the conventional one. As the speed of the output data is halved, the scale of the decimation filter in the present embodiment is the same as that of the conventional decimation filter. Therefore as described above the pulse shaping filter can be omitted in the present embodiment, thus the hardware can be reduced by an amount which corresponds to the amount of the hardware required for the conventional pulse shaping filter.

Simultaneously, to guarantee a predetermined attenuation of a stop band, zero points on a unit circle are individually positioned without duplication at equal intervals except near pass band.

Positioning zero points as described above expresses each term of a transfer function of a filter as a product of a quadratic term of $z^{-1}$ at maximum. The product is converted to the format of $\Sigma[C_i \, z^{-1}]$ to obtain a tap coefficient $C_i$.

A zero point position mainly associated with a characteristic of pass band is not explained clearly by defining it as at least one zero point being positioned outside a unit circle. However, it is temporarily positioned near the point where Z=1, and then finally positioned after applying an actual waveform of an isolated pulse to a filter and checking the output waveform. That is, the zero point position is modified to a more desirable value by carefully examining the isolated pulse response characteristic.

Since one zero point associated with pass band is positioned, it should be located on an actual axis on the z plane, thereby allowing a selectivity of one. At this time, the point should be located such that the distance (time) between the first precursor of an isolated pulse response characteristic and a main cursor shows a desired interval. Assuming that the first precursor refers to the first zero-amplitude point from the main response of an isolated pulse response characteristic, the main cursor can be estimated according to the point to come at the time after the above described point by the baud rate cycle time. Therefore, the zero point should be located such that the amplitude of the main cursor is large enough, that is, the main cursor should be positioned around the center of the main response.

If two zero points associated with pass band are positioned, then they can be either located on an real axis outside and inside a unit circle separately, or located symmetrically centering the real axis outside the unit circle. In the former case, a zero point position is determined outside a unit circle such that the position of a main cursor is located near the point where the main response marks its peak and that the amplitude is large enough. Since the position of a zero point inside a unit circle has an influence on the waveform after a main response, it should be controlled by carefully checking the form. A tap coefficient distribution possibly shows a symmetrical pattern of impulse responses if zero points on the actual axis are located to form mirror image correlation centering the unit circle. In the latter case, on the other hand, since the position implies a complex number, it offers a selectivity of two and allows the distance between the main cursor and the first precursor and between the first precursor and the second precursor to be controlled individually. The second precursor refers to the amplitude at the time after the first precursor during the time taken for a baud rate cycle, and should be zero desirably.

If zero points associated with pass band are located, then the attenuation at stop band is generally more reduced than at times where they are not located. However, in the present invention, the number of taps can be reduced to less than a half of the conventional level by limiting the number of zero points associated with the characteristic near pass band to one or two although a pulse shaping function is provided.

With the decimation filter according to the present invention, the number of taps amounts to double the number of those of the conventional decimation filter. However, since the present invention requires no pulse shaping filters operated at double the basic sampling frequency, the decimation filter according to the present invention can yield an output at double the conventional output cycle, that is, at a basic sampling frequency. However, in the hardware of the decimation filter shown in FIG. 3, the capacity of a ROM grows to double, and the other decimation filters remain at the same circuit scale as that of the conventional decimation filter. Two examples are used in explaining this in detail.

$$H_A(Z^{-1}) = (1 - a_0 Z^{-1})(1 - Z^{-1}/a_0) \cdot \qquad (7)$$

$$\prod_{N=1}^{286} (1 + a_N Z^{-1} + b_N Z^{-2})$$

$$H_B(Z^{-1}) = (1 - a_0 Z^{-1} + b_0 Z^{-2}) \cdot \qquad (8)$$

$$\prod_{N=1}^{286} (1 + a_N Z^{-1} + b_N Z^{-2}).$$

where $z^{-1} = \exp(j2\pi f/15360)$, and $(1 + a_n z^{-1} + b_n z^{-2})$ indicates a function having simple zero points at equal frequency intervals from the basic sampling frequency to around the over-sampling frequency.

In equation (7), where $a_0 = 1 - \alpha$, $1 >> \alpha > 0$, the first and the second terms of the object of $(Z^{-1})$ greatly affect the portion near pass band because the root $a_0$ of the first term and the root $1/a_0$ of the second term are located near the point where $z = 1$. Furthermore, since the root of the first term is a zero point in a unit circle, the root of the second term is a zero point outside the unit circle, these zero points are located on an real axis, and the product equals 1.0, they are located to form mirror image correlation centering a unit circle.

The zero point of the first term of the object of $H_B (Z^{-1})$ is located at $1 + \alpha \pm j\beta$ (where $1 >> \alpha$, $\beta > 0$). That is, it is assumed that two complex zero points are located near the point where $z = 1$ outside a unit circle.

FIGS. 15, 16, 17, and 18 respectively show the loss characteristics of a decimation filter having the function indicated by the above stated equation (7) (the loss of f=0 is normalized as 0 dB), an impulse response (equals the coefficient map of a transversal filter), the isolated pulse response characteristic indicated by an output waveform obtained when a signal pulse transmitted through the longest cable of 7.5 Km is applied, and the isolated pulse response characteristic obtained when the cable length is zero.

FIGS. 19, 20, 21, and 22 respectively show the loss characteristics of the decimation filter having the function indicated by equation (8) above (the loss of f=0 is normalized to be 0 dB), the impulse response (the coefficient map transversal filter), the isolated pulse response characteristic indicated by an output waveform obtained when a signal pulse transmitted through the long cable is applied, and the isolated pulse response characteristic obtained when the cable length is zero.

Figure 1:
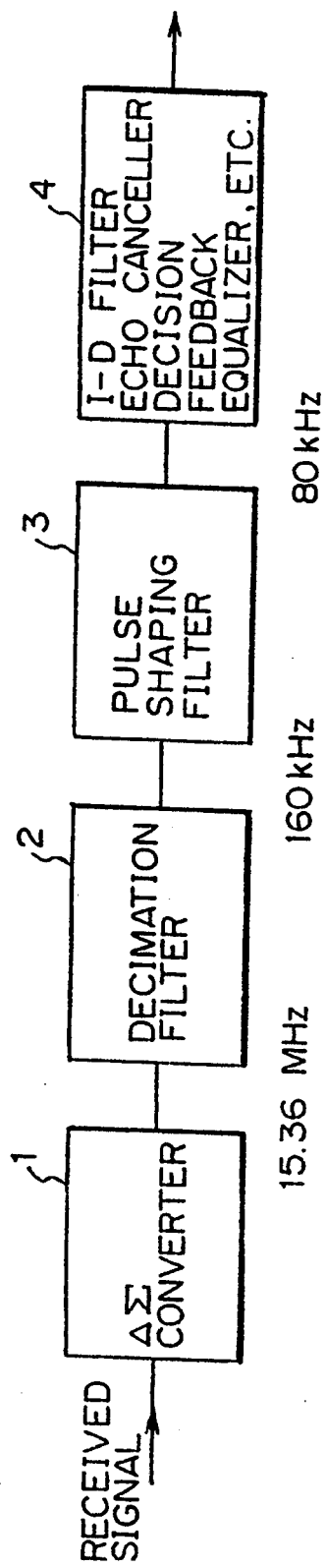
FIG. 1 shows the received signal input unit of the conventional digital subscriber line transmission interface device.
Figure 2:
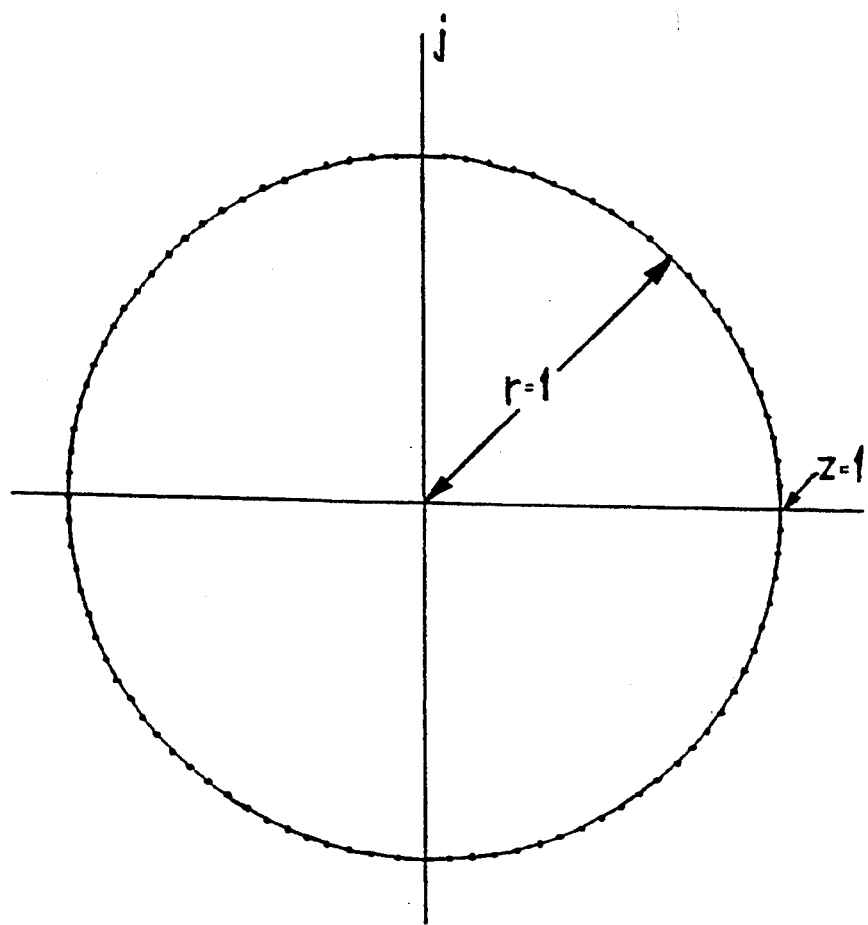
FIG. 2 shows the positions of zero points of the transfer function of the conventional decimation filter.
Figure 3:
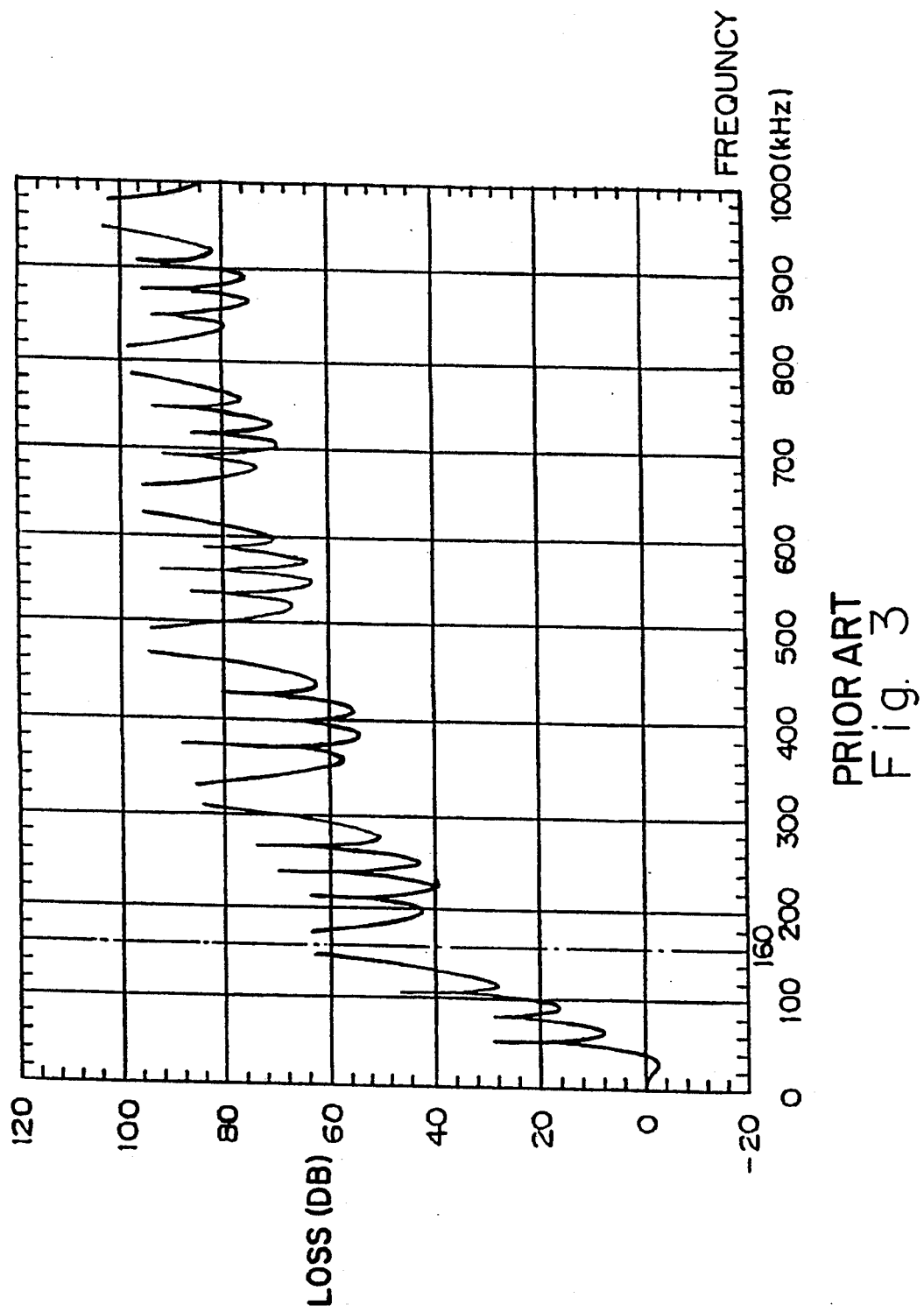
FIG. 3 shows the frequency loss characteristics of the conventional filter comprising a decimation filter and a pulse shaping filter.
Figure 19:
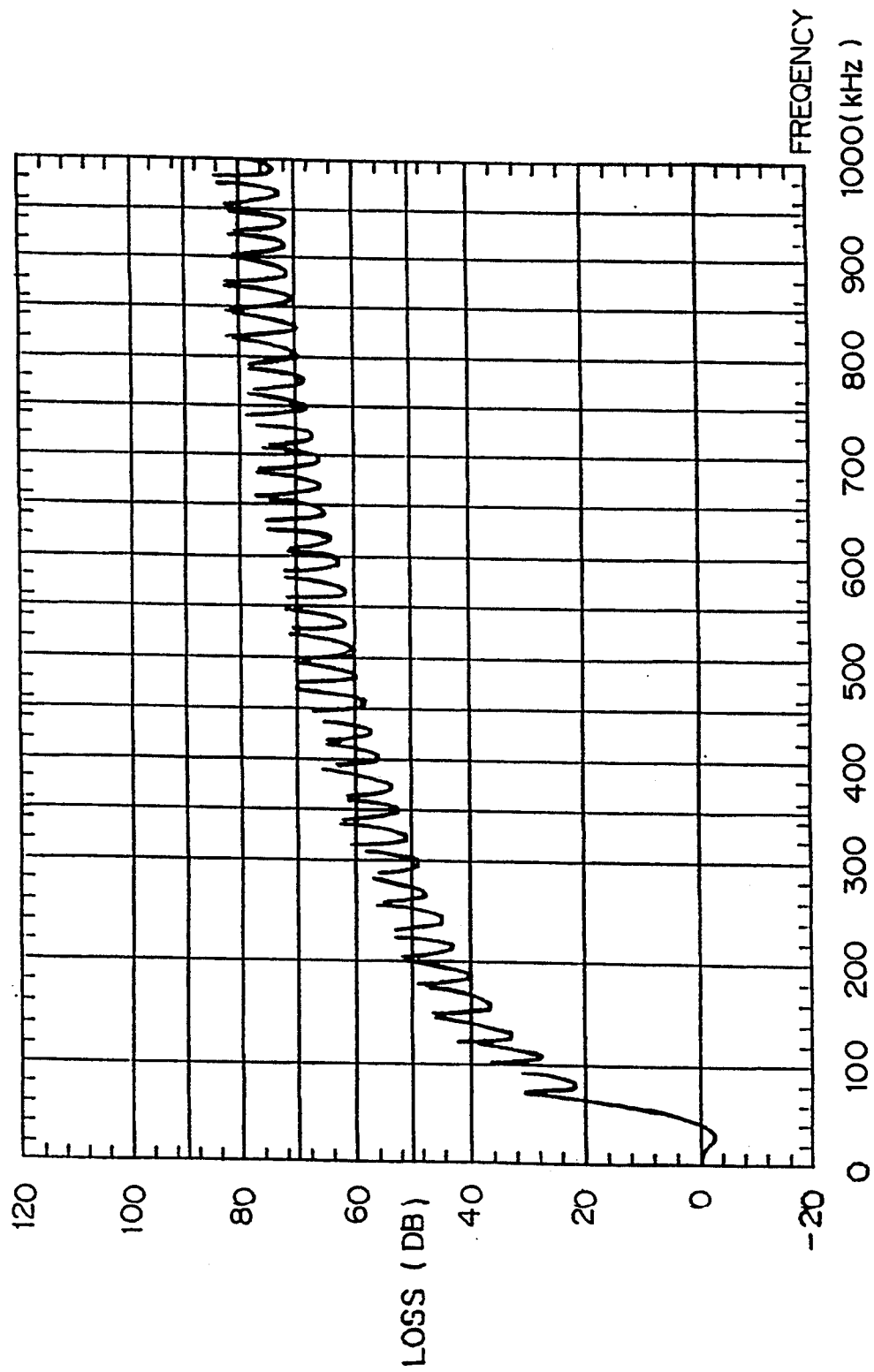
FIG. 19 shows the loss characteristics of the decimation filter having two zero points outside a unit circle according to the present invention.
Figure 20:
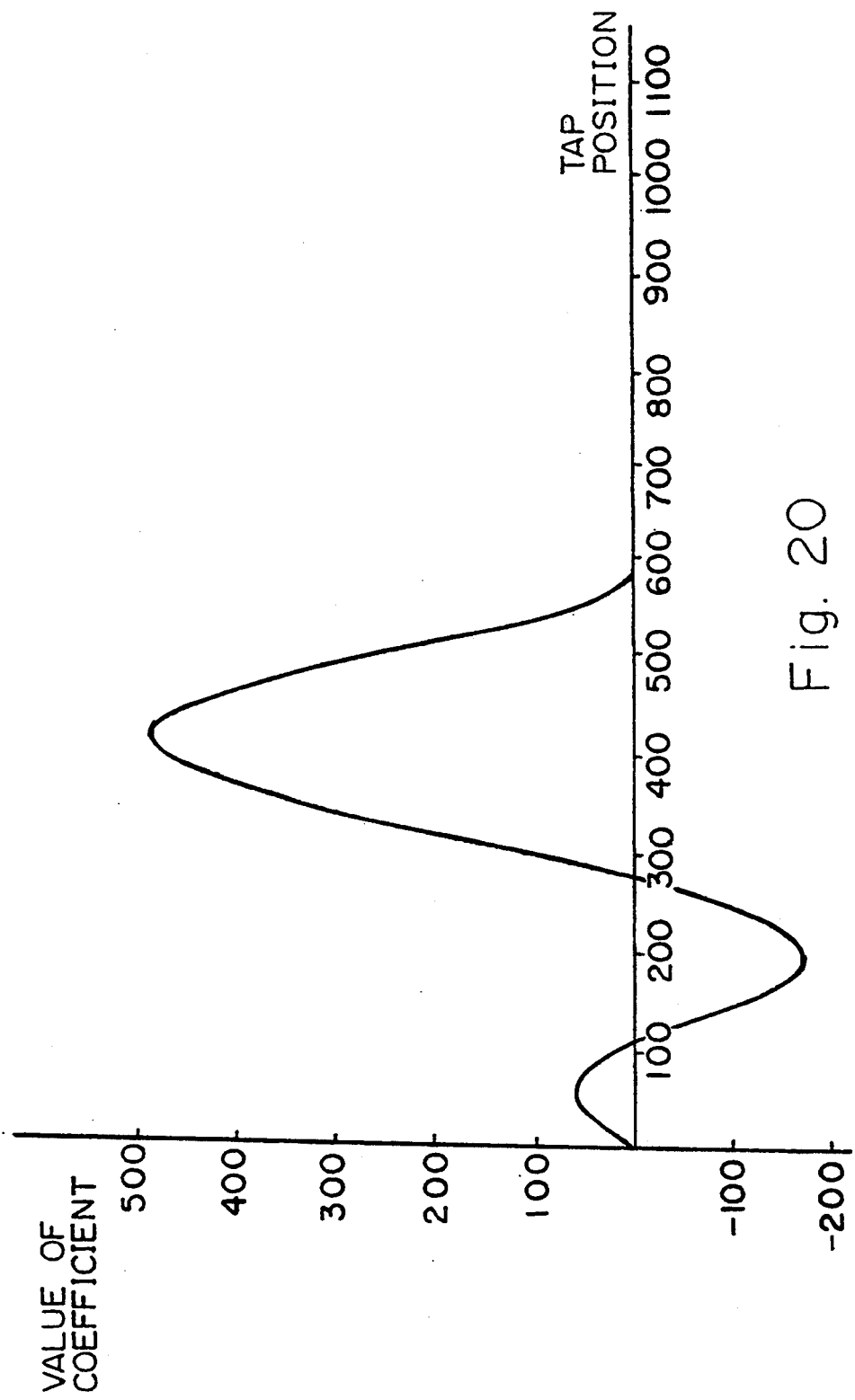
FIG. 20 shows the coefficient map (impulse response) of the decimation filter having two zero points outside a unit circle according to the present invention.
Figure 21:
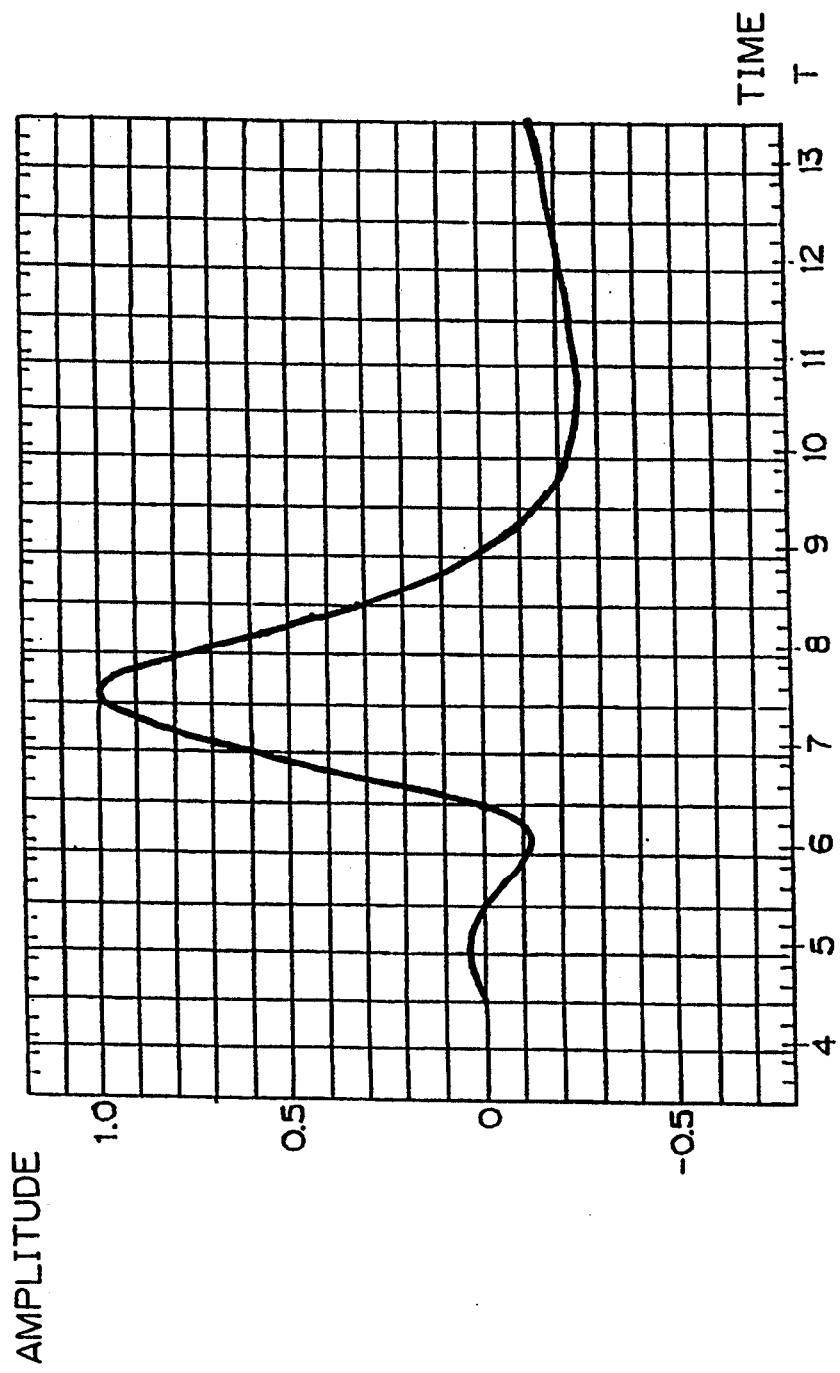
FIG. 21 shows the isolated pulse response characteristic (based on the cable length of 7.5 Km and the peak value of the amplitude) of the decimation filter having two zero points outside a unit circle according to the present invention.
Figure 22:
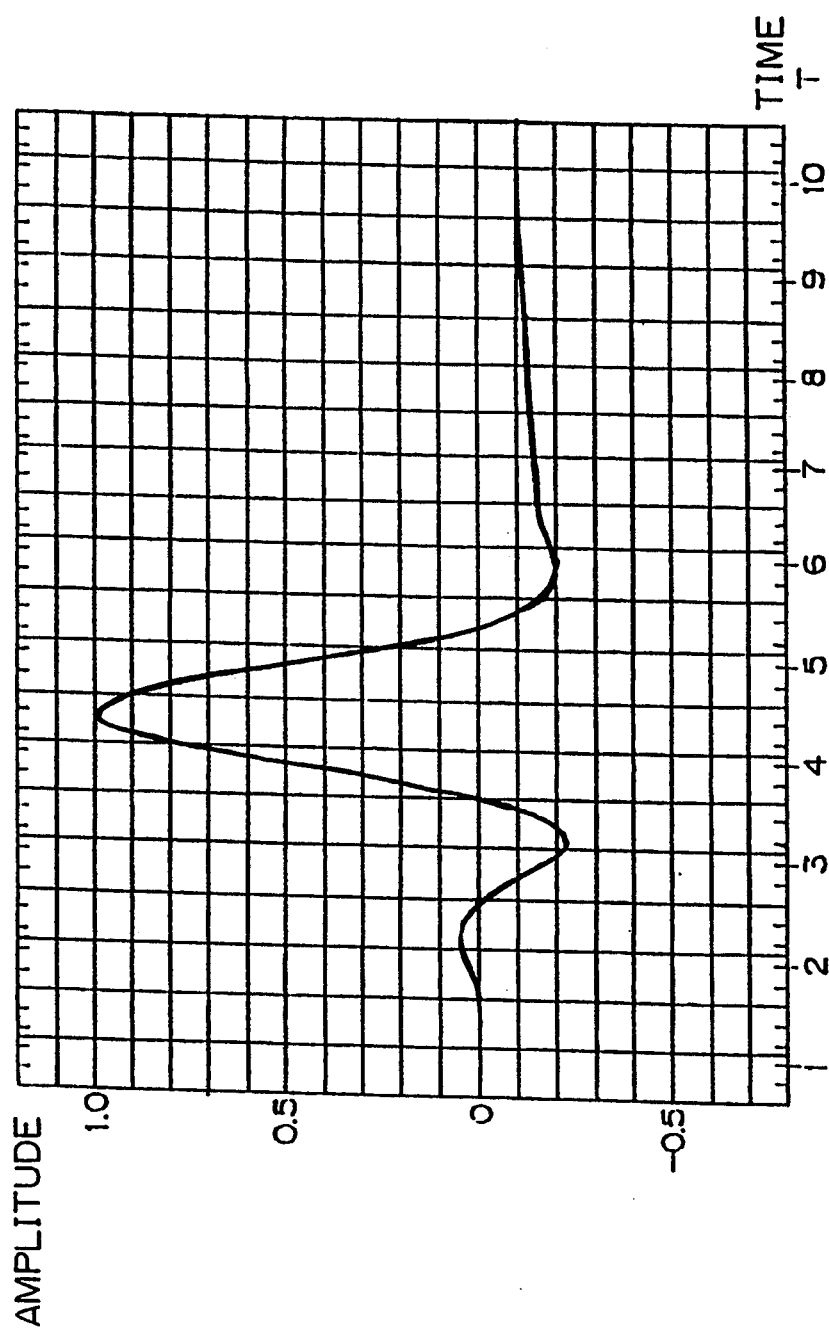
FIG. 22 shows the isolated pulse response characteristic (based on the cable length of 0 Km and the peak value of the amplitude) of the decimation filter having two zero points outside a unit circle according to the present invention.

When the loss characteristic of the decimation filter of the present invention shown in FIG. 19 is compared with the loss characteristic of the conventional filter shown in FIG. 3 (a decimation filter + a pulse shaping filter), the present invention yields a larger attenuation at 70–4000 KHz, while the conventional filter indicates a larger attenuation at a frequency beyond the above stated values. However, the S/N characteristic is nearly constant because the S/N characteristic of an A/D converter is determined by a sum of noises leaking from all frequencies.

The isolated pulse response characteristic shows in response to the transmission pulse from a remote terminal the state of a signal waveform of an A/D converter. The waveform should be generated such that inter-symbol interference can be set to zero by the decision feedback equalizer in the following step. Namely, the amplitude at each post-cursor after the main cursor should be 0.5 or less compared with the amplitude at the main cursor, that is, at the sampling time immediately after the first precursor which is the base in the time direction. It should be set to the minimum possible value because it cannot be corrected in the following step by referring to the amplitude at the second precursor which is a sampling point before the first precursor.

Figure 8:
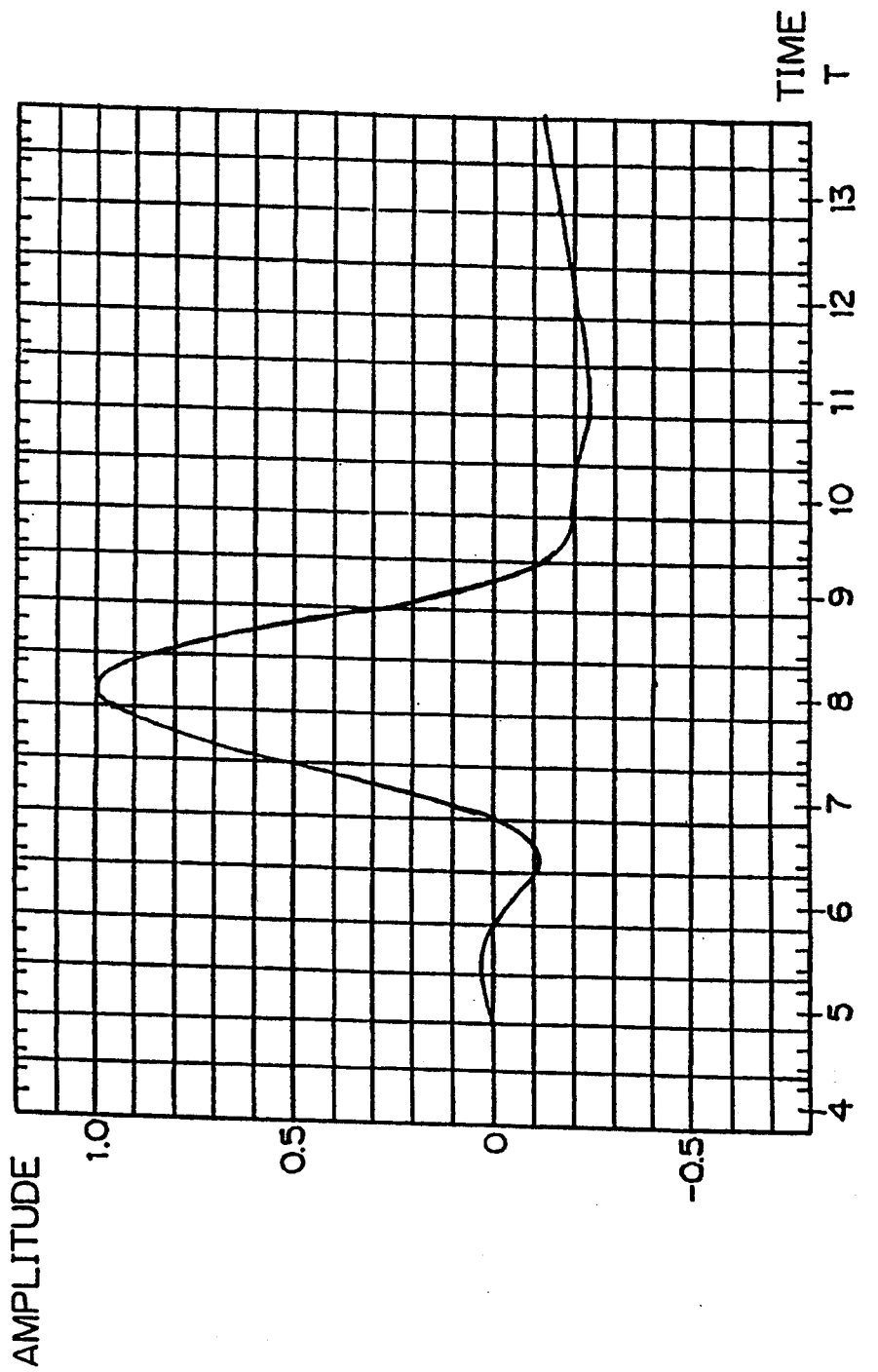
FIG. 8 shows the isolated pulse response characteristic (based on the cable length of 7.5 Km and the peak value of the amplitude) of the conventional filter comprising a decimation filter and a pulse shaping filter.
Figure 9:
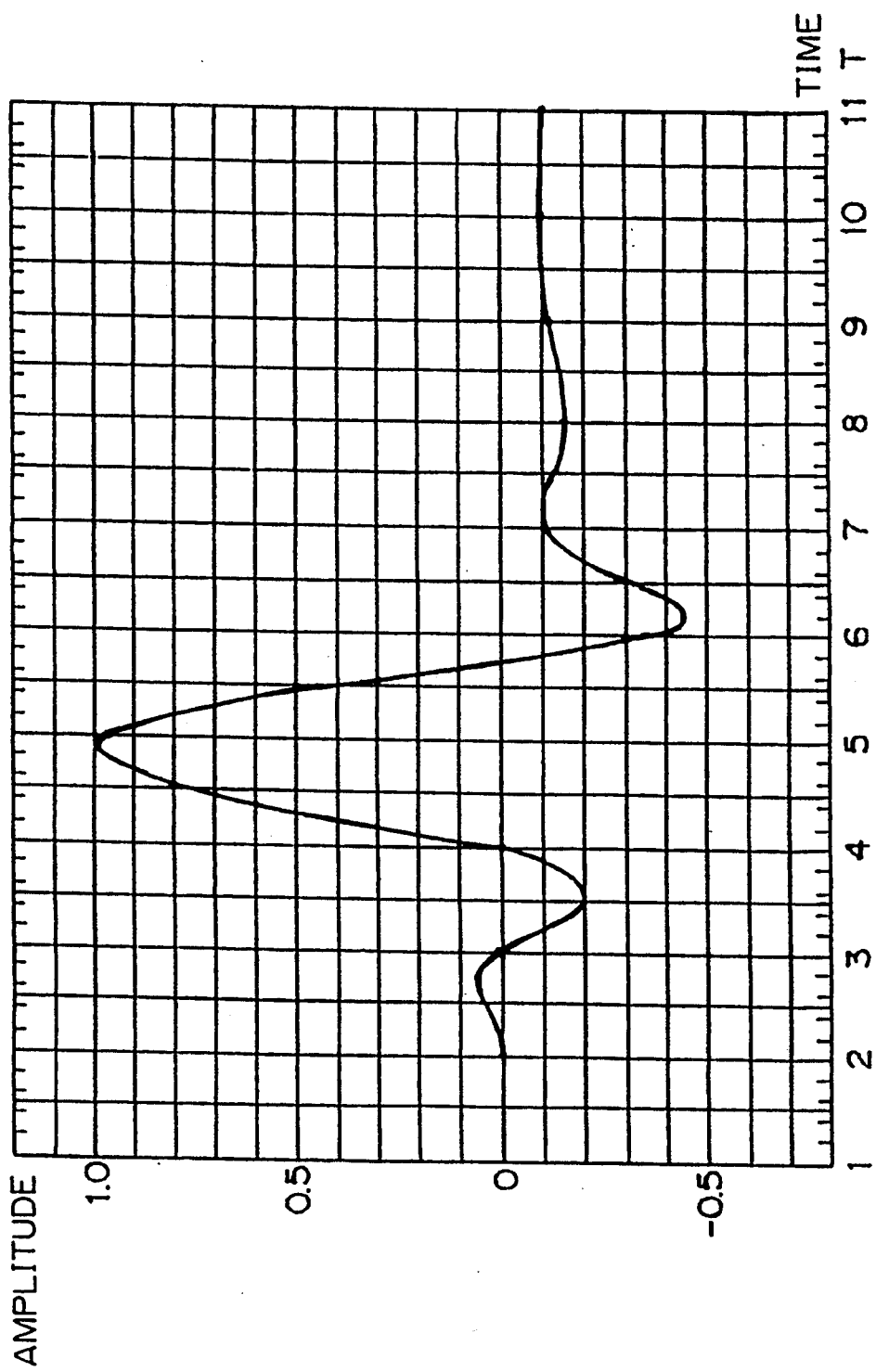
FIG. 9 shows the isolated pulse response characteristic (based on the cable length of 0 Km and the peak value of the amplitude) of the conventional filter comprising a decimation filter and a pulse shaping filter.
Figure 10:
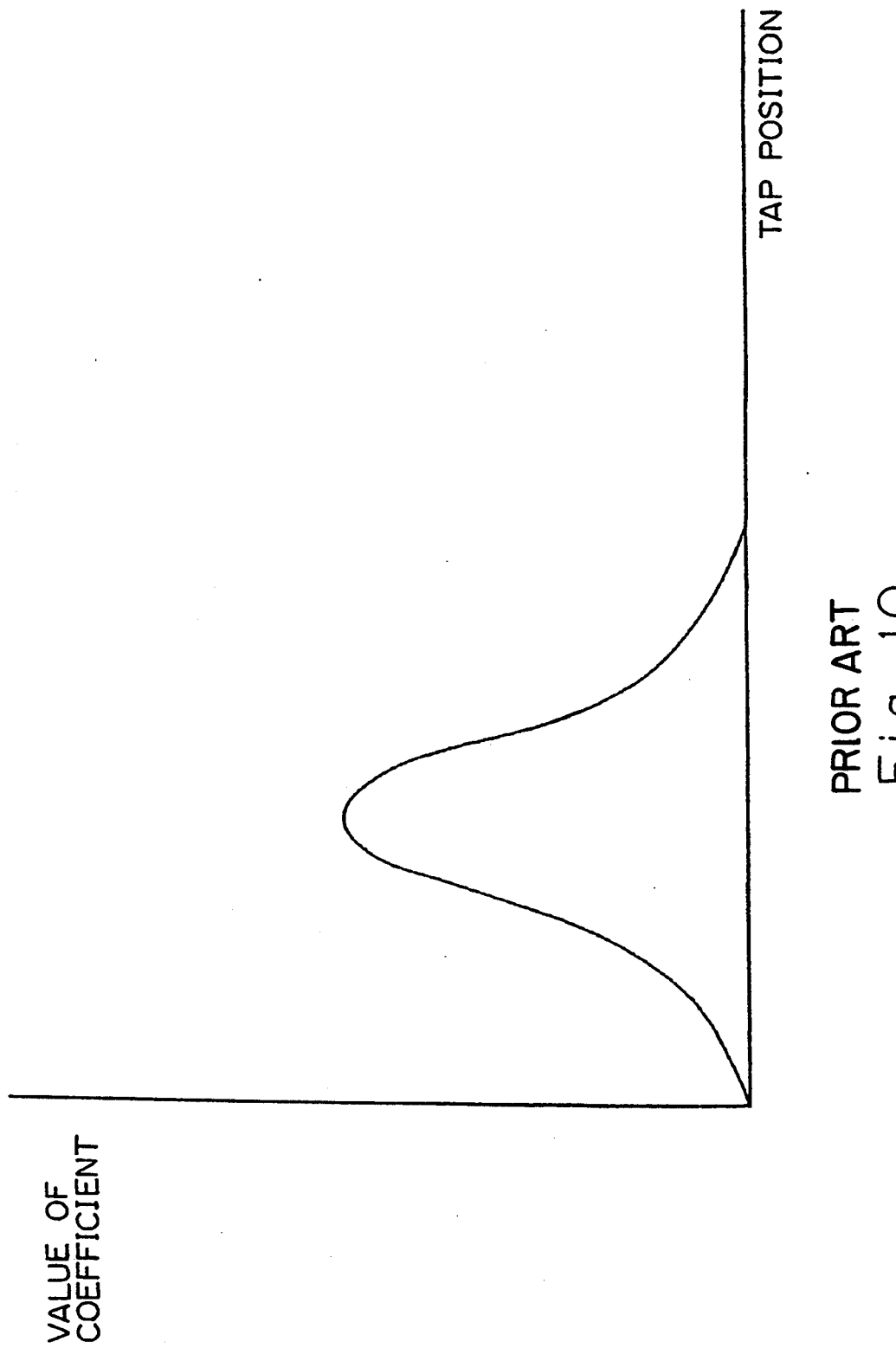
FIG. 10 shows an example of a coefficient map of the conventional decimation filter.
Figure 17:
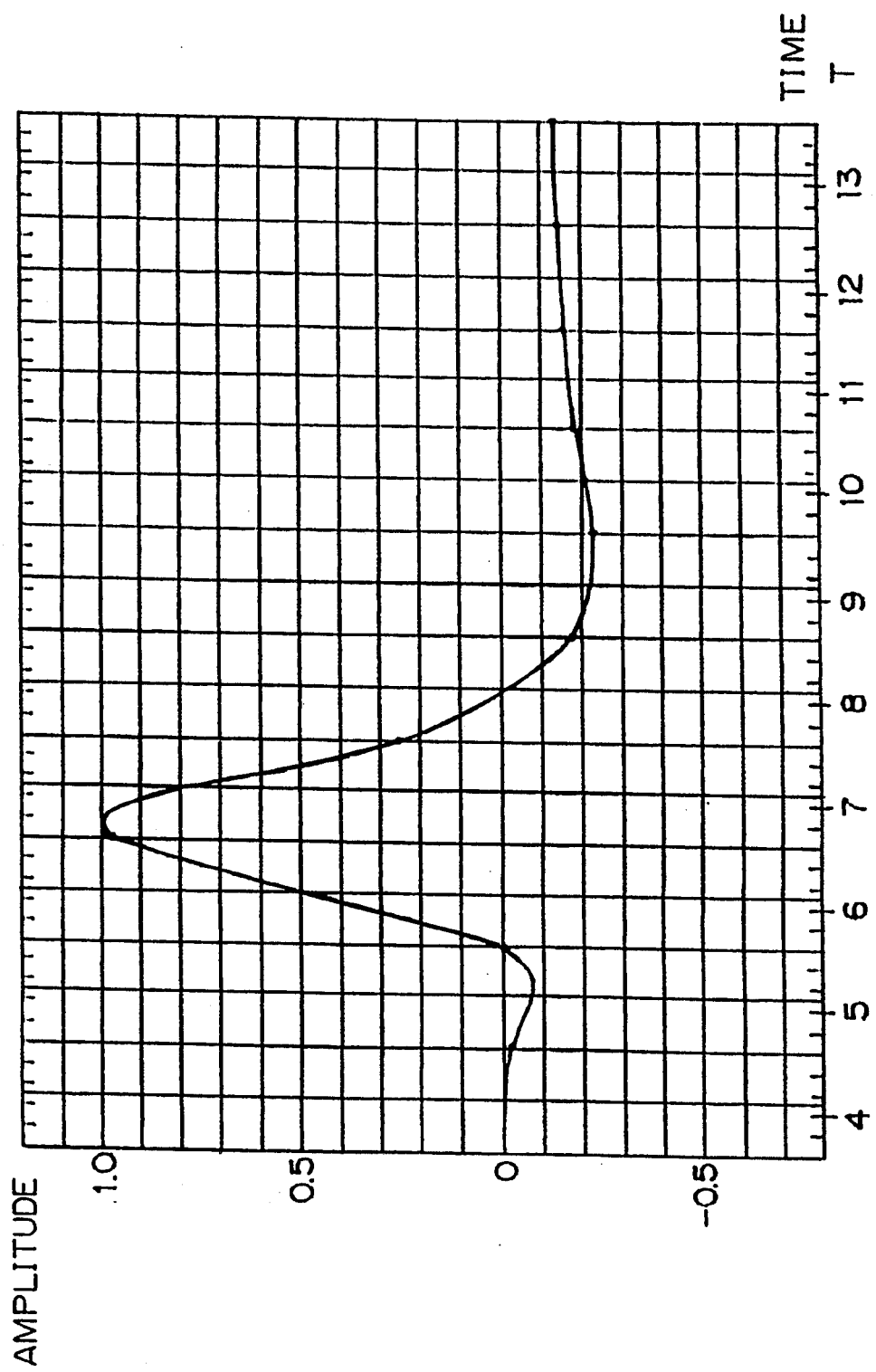
FIG. 17 shows the isolated pulse response characteristic (based on the cable length of 7.5 Km and the peak value of the amplitude) of the decimation filter having one zero point outside a unit circle according to the present invention.
Figure 18:
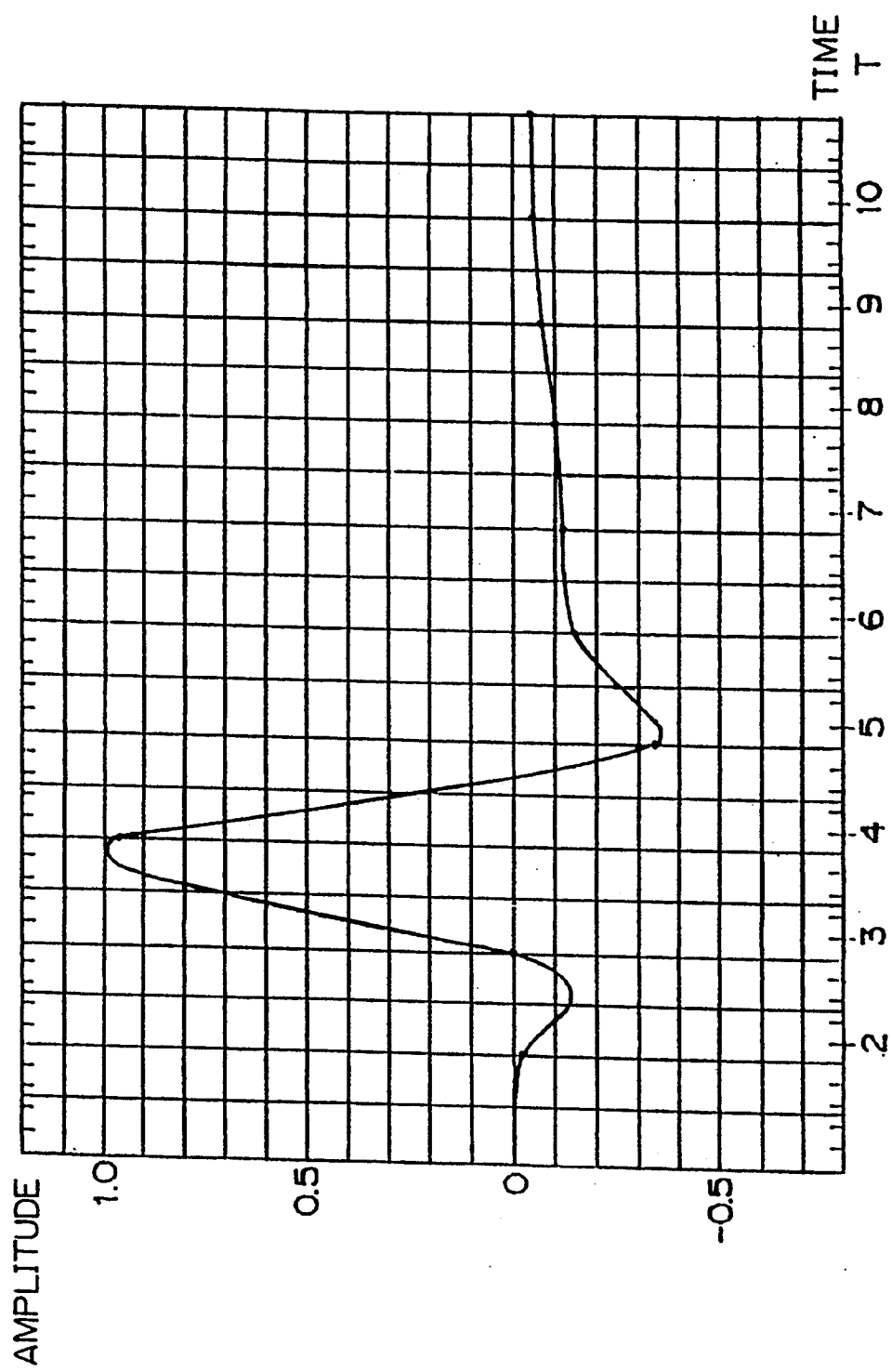
FIG. 18 shows the isolated pulse response characteristic (based on the cable length of 0 Km and the peak value of the amplitude) of the decimation filter having one zero point outside a unit circle according to the present invention.

The contents of FIGS. 17, 18, 21, and 22 mostly meet the conditions described above, and show characteristics similar to those of FIGS. 8 and 9 indicating the conventional isolated pulse response characteristic, thereby causing no problems from the viewpoint of the waveform transmission. In FIGS. 17 and 18, the characteristics at the second precursor deviate by about 0.03 when the peak value of the amplitude r is 1, which does not affect the error rate at all.

Figure 15:
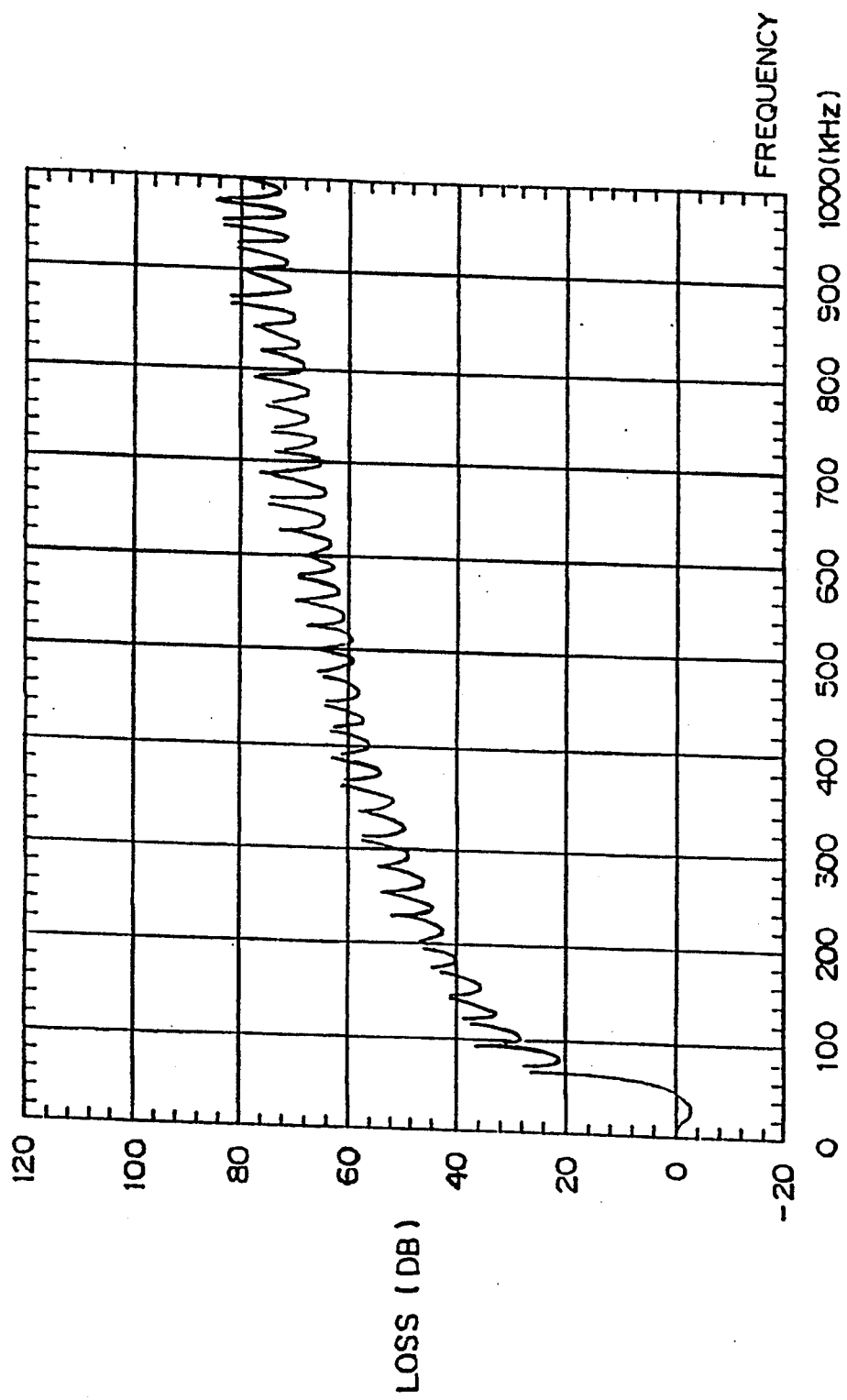
FIG. 15 shows the loss characteristics of the decimation filter having one zero point outside a unit circle according to the present invention.

Next, the coefficient map is explained below. According to the coefficient map shown in FIG. 16, a ringing is detected before and after the main response. This indicates that one of the two zero points associated with pass bands shown by equation (7) is located outside a unit circle, and the other is located inside the unit circle. According to the coefficient map shown in FIG. 20, two ringings are detected before the main response. This indicates that two zero points associated with pass bands shown by equation (8) are located outside a unit circle. If FIG. 15 is compared with FIGS. 17 and 18, and FIG. 20 with FIGS. 21 and 22, it is found that according to the isolated pulse characteristics the amplitude can be changed from negative to positive at the first precursor if it is set to indicate a negative value for a moment before the main response in the coefficient map.

Summing up the present invention, the function of the decimation filter of the present invention is calculated by equations (7) and (8) as follows.

$$H(z^{-1}) = \sum_{i=0}^{376} b_i z^{-1} \quad (9)$$

It implies a transversal filter process, and can be divided into three terms as follows (10).

$$H(Z^{-1}) = \sum_{i=0}^{191} b_i Z^{-1} + \sum_{i=192}^{383} b_i Z^{-1} \sum_{i=384}^{375} b_i Z^{-1} \quad (10)$$

Equation (10) contains 3 terms, but the coefficient of each term is double the value in equation (5). The conventional decimation filter necessarily yields an output at every 160th KHz, while equations (7) and (8) indicate an output at every 80th KHz, thereby allowing double the time to be taken for processing each term.

The decimation filter shown in FIG. 13 is explained in detail. ROM M1, selector S1, adder A1, and register R1 form a module for calculating the first term of equation (10). ROM M2, selector S2, adder A2, and register R2 form a module for calculating the second term of equation (10). ROM M3, selector S3, adder A3, and register R3 form a module for calculating the third term of equation (10).

Equation (10) is expressed in terms of $Z^{-1}$, and the actual process is performed such that signal data Xi inputted at 15.36 MHz are multiplied by filter coefficients bi, and 576 such products are obtained and summed to form the output of the filter. Since the actual input is +1 or −1, a sum of products can be calculated by an adder. If an adder performs an addition in every cycle at 15.36 MHz, 192 additions can be performed An the time period corresponding to 80 KHz. Therefore, three (576/192) adders must be provided in parallel to obtain an output at 80 KHz. The first term of equation (10) performs an addition for the portion containing filter coefficients 0 through 191, the second term of equation (10) performs an addition for the portion containing filter coefficients 192 through 383, and the third term of equation (10) performs an addition for the portion containing filter coefficients 384 through 575.

Figure 23:
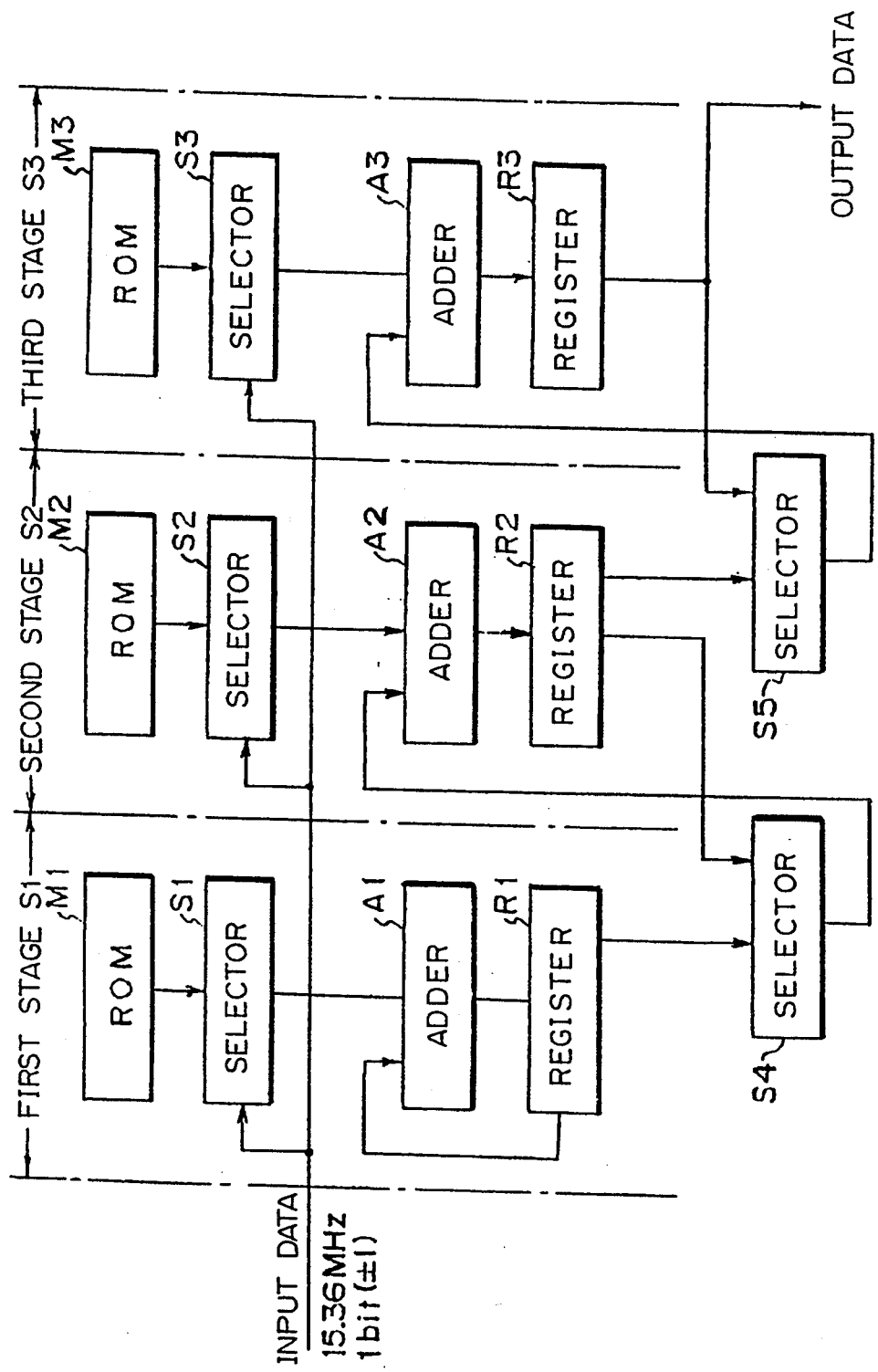
FIG. 23 shows a block diagram of a decimation filter with a pulse shaping function according to the embodiment of the present invention.

In FIG. 23, ROM M1 stores filter coefficients 0 through 191, ROM M2 stores filter coefficients 192 through 383, and ROM M3 stores filter coefficients 385 through 575. If an input signal Xi is positive, a coefficient from a ROM is applied as is to an adder, and it is applied after being inverted if Xi is negative. The sum is fed back to the input part of the adder, and the addition is repeated 192 times.

Normally, selectors S4 and S5 apply the output of register R2 to adder A2 and apply the output of register R3 to adder A3. However, at cycles corresponding to a multiple number of 192, selectors S4 and S5 apply the output of register R1 to adder A2 and the output of register R2 to adder A3. Likewise, the output of register R3 is outputted as the output of the filter. In this cycle, the route from register R1 to adder A1 is omitted, and adder A1 starts its addition at zero.

Figure 24:
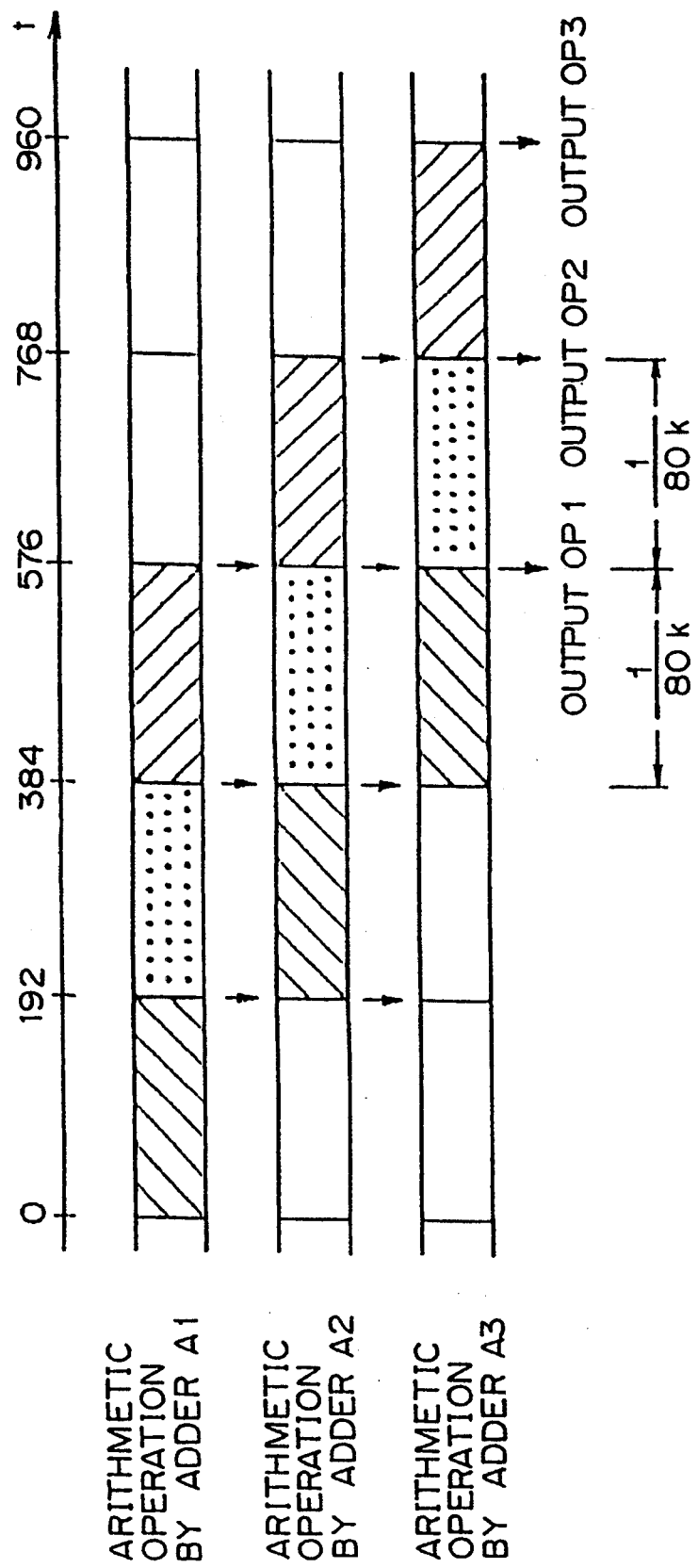
FIG. 24 shows a timing chart of a decimation filter with the function of shaping the waveform shown in FIG. 23.

As a result, the contents of register R2 are obtained by adding the sum of the second term to that of the first term, and the contents of register R3 are obtained by adding the sum of the third term to those of the first and second terms. The sum of the 192th addition of register R3 indicates the result of the arithmetic operation according to equation (10). FIG. 24 shows the time chart of these operations.

Accordingly, with the conventional decimation filter, the selectors 4 and 5 operate at every 96th cycle, that is, at 160 KHz. On the other hand, the present invention operates them at every 192th cycle. As for a ROM, the conventional ROM stores 96 words, while the present invention requires 192 words. However, the hardware for a ROM can be configured on a small scale.

Since an embodiment of the decimation filter of the present invention realizes a 573-tap 80 KHz transversal filter, it can be configured on a hardware scale almost the same as that of the conventional decimation filter which is a 286-tap 160 KHz transversal filter (half the frequency permits multiplexing processes). Therefore, processes for the hardware corresponding to the conventional pulse shaping filter can be eliminated. A pulse shaping filter requires a logical gate containing approximately 1500 gates for the above stated conventional 8-tap 160 KHz unit, and can be omitted desirably.

The first embodiment is advantageous over the prior art in that the circuit scale can be reduced. However, with regard to the ROM, the power consumption is not sufficiently small.

In order to reduce the power consumption, the use of ROM is not necessarily useful. In order to avoid the use of ROM, it is necessary to use a comb type filter as a decimation filter since the comb type filter has regular coefficients and thus its filter coefficients can be produced by random logic. In order to further reduce the power consumption and the circuit scale, it is preferable to reduce the data output frequency from the decimation filter as much as possible and preferably to reduce the data output frequency to the minimum baud rate.

The conventional decimation filter generally produces the output data at a frequency twice the baud rate. This is because the first pulse shaping filter must be operated at the frequency twice the baud rate. It is necessary for performing a complete waveform shaping operation that the pulse shaping filter operates at twice the band frequency. Generally speaking when the operation frequency of the pulse shaping filter becomes higher and the order of the pulse shaping filter is raised, the waveform shaping operation can be performed in more precise manner, and the output waveform has less inter-symbol interference. Further echo-canceling and a conversion by a decision feedback equalizer for correcting the remaining error at the postceding stage can be performed with certainty and at a high speed.

The algorithm of the postceding AGC, decision feedback equalizer and echo-canceler for training the data from the digital subscriber line transmission system in accordance with the state of a transmission line has been greatly improved with regard to the convergence time and the scope in which a convergence occurs has been expanded. The coefficients of the equalizer can be trained by utilizing the random properties of the transmission lane code. Immediately after the start of the training, only the AGC relating to the level and the frequency loss characteristic of the transmission line is trained at a first stage, then all the coefficients are trained using a LMS (least mean squares) algorithm at a second stage and then a sin LMS algorithm is used after a training has been performed to some extent to. Thus, the method of updating the coefficients is changed depending on the stages of the convergence, thereby enabling training of the coefficients to be performed even if the isolated pulse response of the input signal is distorted to a certain extent.

By noting a recent development of a convergence algorithm for the decision feedback equalizer and the echo-canceler, the scale of the pulse shaping filter can be reduced as compared with the conventional one. When the prior art characteristic of the pulse shaping filter is defined such that the shape of the post-cursor portion of the isolated pulse response is made sufficiently small, we have noted that the role of the pulse shaping filter is merely to change the amplitude of the isolated pulse response from negative to positive at a precursor point as this change of amplitude is necessary for controlling a timing phase. The isolated pulse response after passing the decimation filter, the high-pass filter and the AGC circuit for correcting the frequency loss characteristic of the transmission line is shown in FIG. 8A if the pulse shaping filter is not provided. Therefore, by multiplying the waveform by a number less than 1 and inverting the polarity of the waveform and shifting the inverted waveform forward by one sampling period and added to the original waveform, the amplitude of the waveform can be changed from negative to positive at the point precursor.

Another embodiment of the present invention is to provide a transversal pulse shaping filter in which a waveform of the isolated pulse response up to the input of an inter-symbol interference compensator provided on the receiving side of a transmission line for transmitting a multi-value level signal comprising at least two values at a predetermined symbol period T is pulse-shaped so that the polarity of the waveform of the isolated pulse response is inverted at the time preceding the time of the maximum value of the waveform by time period T. The transfer function H (z) expressed by the z conversion is expressed as follows.

$$H(z) = 1 - az^{-1}, \text{ where } a > 1$$

Figure 25A:
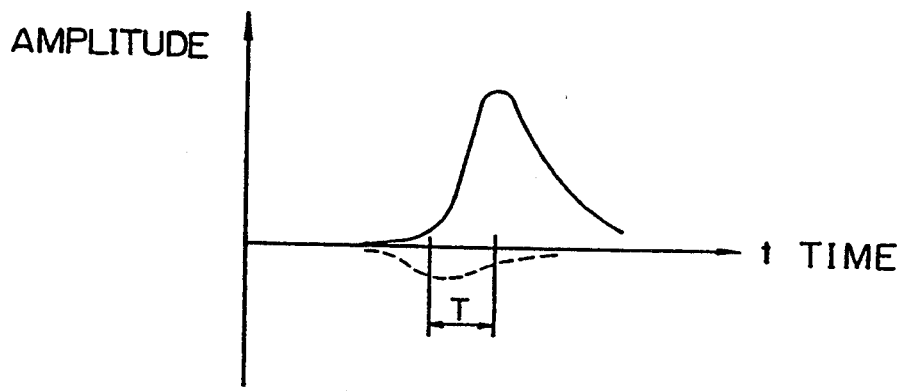
FIG. 25A and 25B show waveforms for explaining the operation of the present invention.
Figure 25B:
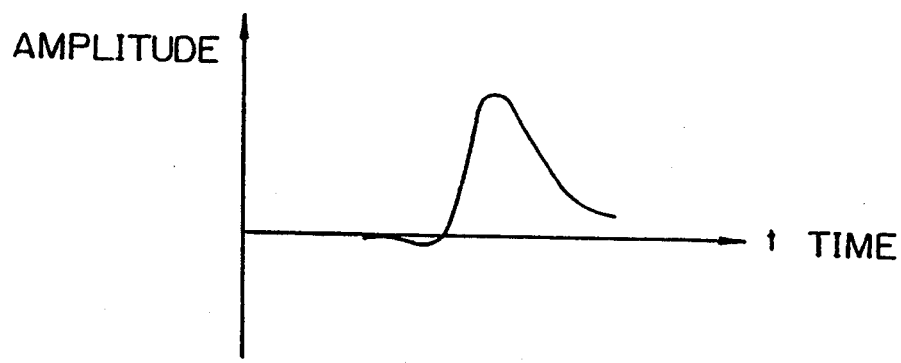

The transfer function H(z) is $-az-1$ and $1-az-1 = -a(-1/z+z-1)$. When the above function is considered in the time domain, $Z^{-1}$ can be considered as an operational function representing a time delay of one sampling period. Thus, this corresponds, in a time region, to the process in which the waveform obtained by multiplying the input signal by $(-1/a)$ is added to the waveform obtained by delaying the input signal by one period T and then multiplied by $=a$. That is, if the isolated pulse response before the pulse shaping is shown by the waveform designated by the solid line in FIG. 25A, the waveform multiplied by $-1/a$ becomes the waveform as shown by the dotted line in FIG. 25A. The two waveforms are synthesized to provide the waveform shown in FIG. 25B which is pulse-shaped so that the polarity of the waveform is inverted at the time preceding the time of the maximum value of the waveform by one period. As $1/a < 1$, the waveform represented by the first term of within parenthesis in the above transfer function H is smaller than that represented by the second term with respect to amplitude. Therefore, even if the input waveform does not exhibit a ringing, the output waveform exhibits a ringing at the head of the waveform. A multiplication by $-a$ merely changes the gain of the whole waveform but does not affect the waveform of the isolated pulse response. The point at which the polarity is inverted is slightly shifted, towards the side of the maximum value (the side of the main cursor) from the time preceding the time of the maximum value of the waveform by one cycle. This becomes more extreme as a is closer to 1. When the value of a is sufficiently greater than 1, the amount of such shifting is small. Thereby sample timing can be sufficiently controlled using this inverting point.

The filter expressed by the above-mentioned transfer function can be realized by a filter with two taps which operates at the symbol frequency and can be greatly simplified compared with the prior art method.

Figure 26:
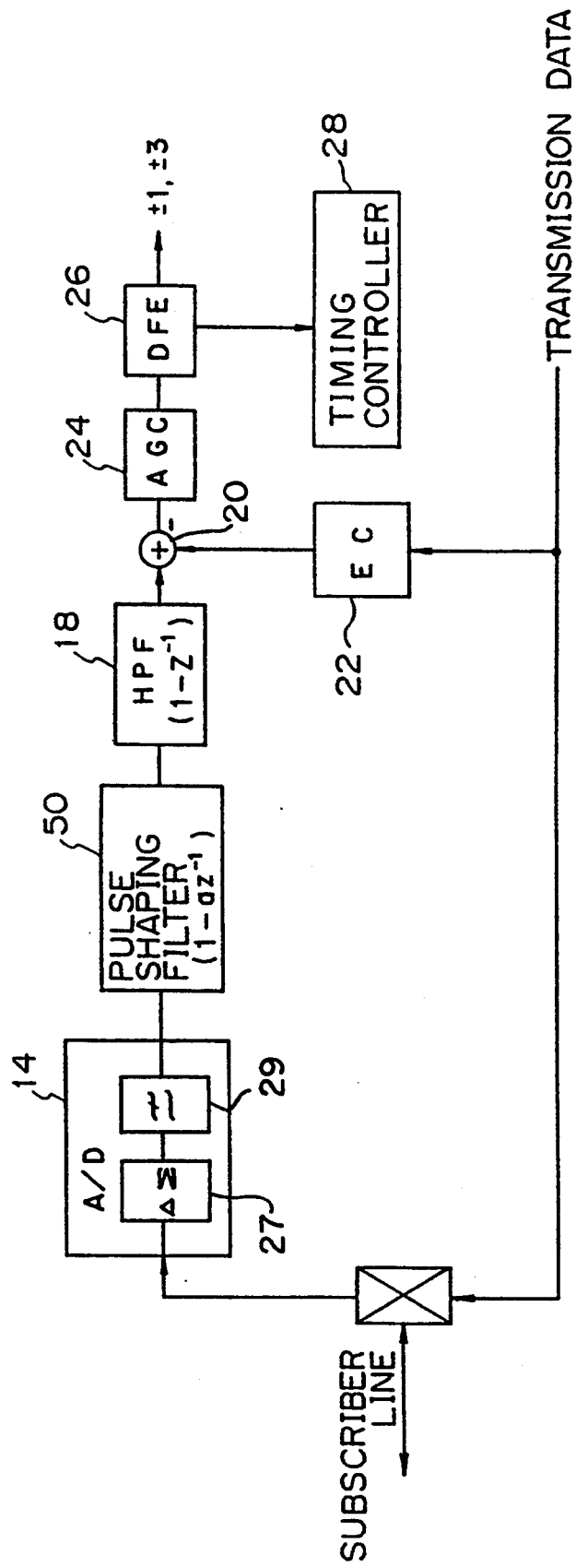
FIG. 26 shows a block diagram of the digital subscriber line interface apparatus in which the pulse shaping filter of the embodiment of the present invention is used.

FIG. 26 shows a block diagram of a digital subscriber line interface apparatus according to an echo-canceler system in which a pulse shaping filter 50 of the present invention is used. The FIG. 26 is the same as the FIG. 12 except that the pulse shaping filter has the following transfer function $$H(z) = 1 - az^{-1}, \text{ where } a > 1 \tag{11}$$

When the value of a is near 1, the shift of the position at which the polarity is reversed becomes large and the values of postcursors $C_1, C_2 \ldots C_m$ become more than half the main cursor value $C_0$, thereby making the equalization at the decision feedback equalizer 26 difficult. When the value of a is too large, the value of $1/a$ becomes small and the effects of the inversion of the polarity become small. Thus in the long transmission line in which the precursor value $C_{-1}$ without the pulse shaping is large, the inversion of the polarity cannot be achieved, thereby failing to extract a timing. Therefore, in accordance with the characteristic of the transmission line to be used, the value of a is determined to be sufficiently large and is selected so that the inversion of the sign occurs in a region around the precursor. With regard to 16 states of the transmission line decided in the standard 16 isolated responses calculated in accordance with a computer simulation including the hybrid transformer 12 and decimation filter 29 it is determined whether the timing extraction and equalization by the decision feedback equalizer 26 can be performed easily, so that an appropriate value of a is determined.

As described above the pulse shaping filter operate at the baud rate and the transfer function of the pulse shaping filter may be simply $1-a-z^{-1}$ where a is larger than 1.

Where $a=8$, for example, we have performed a simulation of a digital subscriber line transmission system with the above transfer function, and the error ratio after the training at a sufficiently short time is sufficiently low with regard to 15 model transmission lines given in a standard book issued by American National Standards Institute (ANSI).

As described in the present embodiment, even if the pulse shaping filter which is a transversal filter with two taps and operates at the baud rate is used, a digital subscriber line transmission system can be trained by utilizing a recent development of a training algorithm. As a result, the data output speed from the decimation filter can be the baud rate speed and the scale of the hardware becomes half that of the conventional one, and the power consumption becomes half that of the conventional one in accordance with the reduction of the scale.

As described above, a filter with the following transfer function is used for high-pass filter 18.

$$1-z^{-1} \quad \ldots (12)$$

Figure 27A:
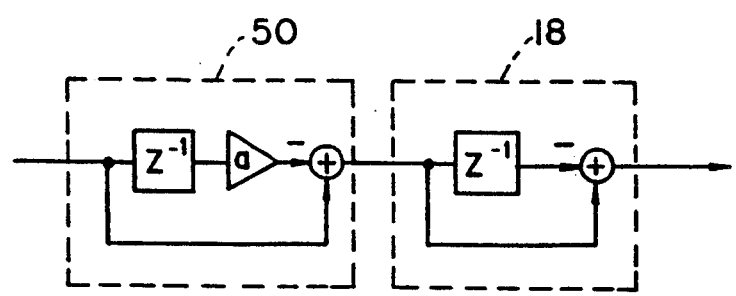
FIG. 27A shows a block diagram of a pulse shaping filter according to th embodiment of the present invention.

As shown in FIG. 27A, pulse shaping filter 50 and high-pass filter 18 may be formed separately and are connected in cascade. These two filters 50 and 18 comprise transversal filters operating at the same symbol frequency and thus can operate more effectively if they operate as a single filter.

The pulse shaping high-pass filter of the present invention is to provide a transversal type pulse shaping high-pass filter in which the waveform of an isolated pulse response at the input of a decision feedback equalizer provided on the receiving side of a transmission line for transmitting a multi-value level signal comprising at least two values at a predetermined symbol period T is wave-shaped so that the polarity of the waveform of the isolated pulse response is inverted at the time preceding the time of the maximum value of the waveform by time period T and in which only the high frequencies of the signal are allowed to pass. The transfer function H(z) expressed by the z parameter is as follows.

$$H(z) = -1/(1+a) + z^{-1} - a/(1+a) \cdot z^{-2}$$

where $a > 1$.

The high-pass filter provided at the succeeding step of the pulse shaping filter has a transfer function of $1-z^{-1}$. Therefore, the synthesis, H(z), of the above transfer functions is as follows.

$$\begin{aligned} H(z) &= (1-az^{-1})(1-z^{-1}) \\ &= 1-(1+a)z^{-1}+az^{-2} \end{aligned}$$

$H(z) \times (-1/(1+a))$ ks newly represented H(z) and the following equation is obtained.

$$H(z) = -1/(1+a) + z^{-1} - a/(1+a) \cdot z^{-2} \quad (13)$$

Thus, the filter with this transfer function forms a transversal filter of three taps having the functions of both pulse shaping and high frequency passing.

The filter with the synthesized function is called a pulse shaping high-pass filter.

Figure 27B:
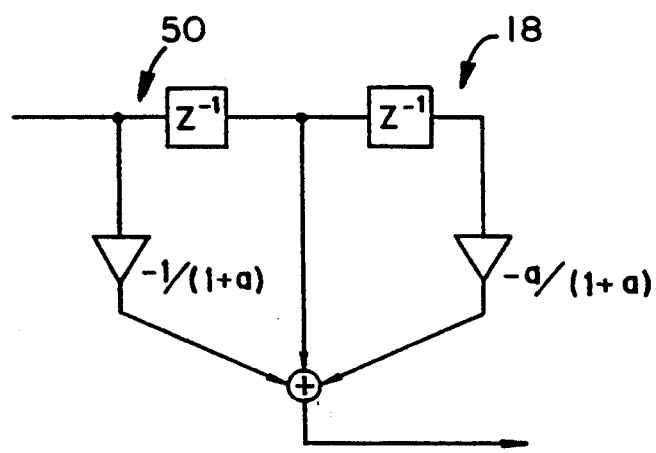
FIG. 27B shows a block diagram of a pulse shaping high-pass filter according to the embodiment of the present invention.

If this is expressed by a block diagram, a transversal filter with 3 taps is configured as shown in FIG. 27B.

Figure 28:
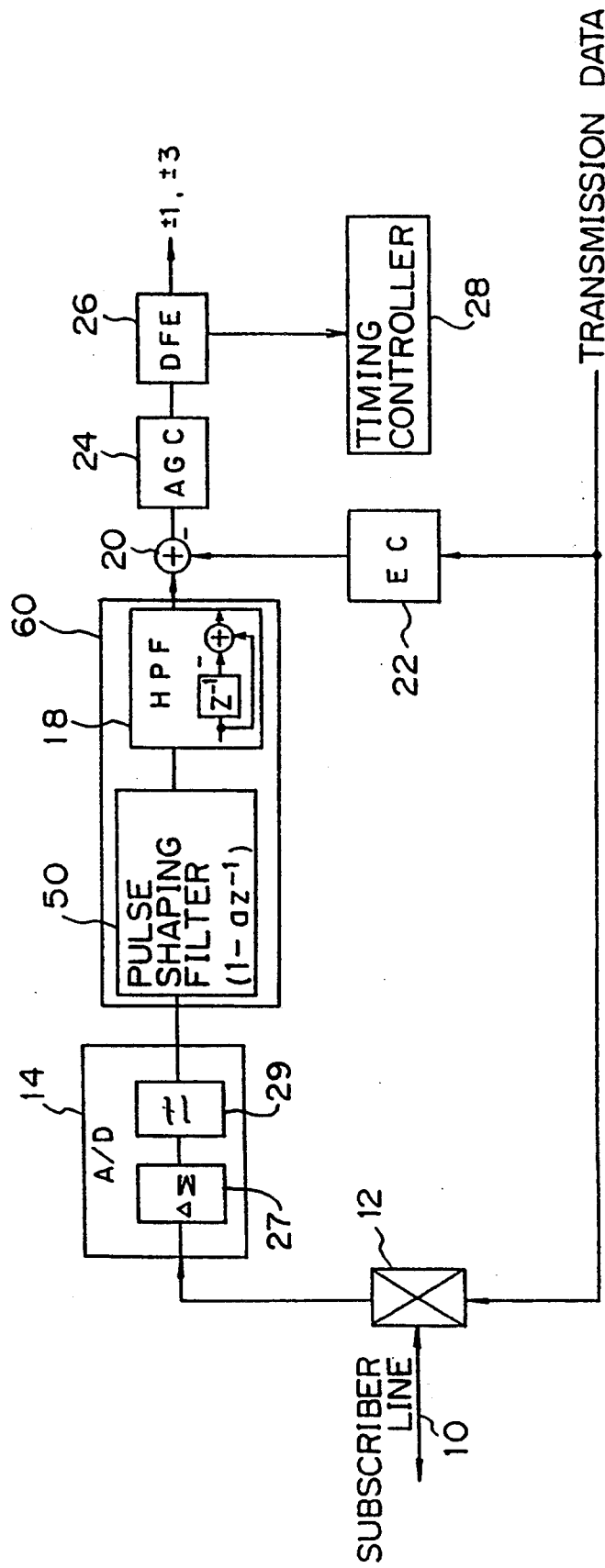
FIG. 28 shows a block diagram of a digital subscriber line interface apparatus in which the pulse shaping high-pass filter of the embodiment of the present invention is used.

FIG. 28 shows a block diagram in which a pulse shaping filter 50 is integrated with a high-pass filter 18 to provide a pulse shaping high-pass filter 60.

If the value of a is determined to be 3, 7, 15 ... so that the value of (1+a) becomes a power of 2 such as 4, 8, 16, the value of $-1/(1+a)$ becomes a power of 2. As $-a/(1+a) = 1 - 1/(1+a)$, $-a/(1+a)$ can be expressed as the difference of two powers of 2. Thus an operation of this filter can be performed in several steps by using a numerical operation block (ALU) comprising an adder and a shifter.

The transfer function is expressed by the following equation when $a=7$ as a concrete example.

$$\begin{aligned} H(z^{-1}) &= 0.125 + z^{-1} - 0.875z^{-2} & (14) \\ &= -2^{-3} + z^{-1} + (2^{-3} - 1)z^{-2} & (15) \end{aligned}$$

Figure 29:
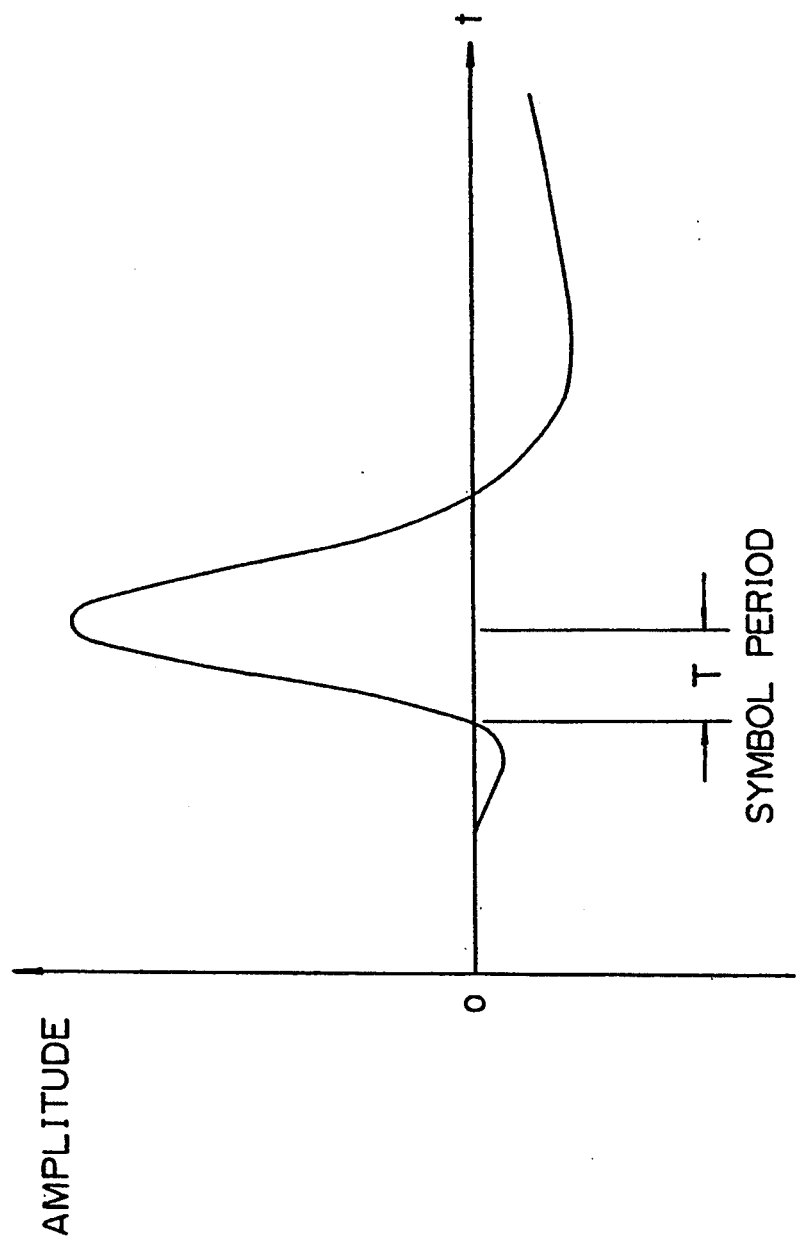
FIG. 29 shows an example of an isolated pulse response at the output of the filter with the transfer function according to the embodiment of the present invention.

An example of an isolated pulse response at the output of the filter with a transfer function in equation (14) is shown in FIG. 29. In this figure, the amplitude of the signal changes from negative to positive at the time which precedes by 1 period the time at which the signal peaks and thus the characteristic at the precursor point can be used for timing control.

When $a=7$, the tap coefficients of the transversal filter can be expressed by a combination of powers of 2 as shown in equation (15). Thus, when the filter process expressed by the equation (14) is performed by using ALU (arithmetic logic unit) 56 comprising 2 input adders 52 and a shifter 54 in FIG. 30, the process will be complete after performing the 4 steps.

1. The polarity of the most recent input data is inverted and is shifted to the left by 3 bits and is added to 0.

2. The input data preceding the most input data one period is added to the above addition result.

3. The input data preceding the most recent data by 2 periods is inverted and is added to the above addition result.

4. The input data preceding the most recent data by 2 periods is shifted to the left by 3 bits and is added to the above addition result.

In the above process, in place of the steps 1 and 2, the following process is also possible. The most recent input data is inverted and shifted left by 3 bits and is added to the input data preceding it by 1 period.

Figure 30:
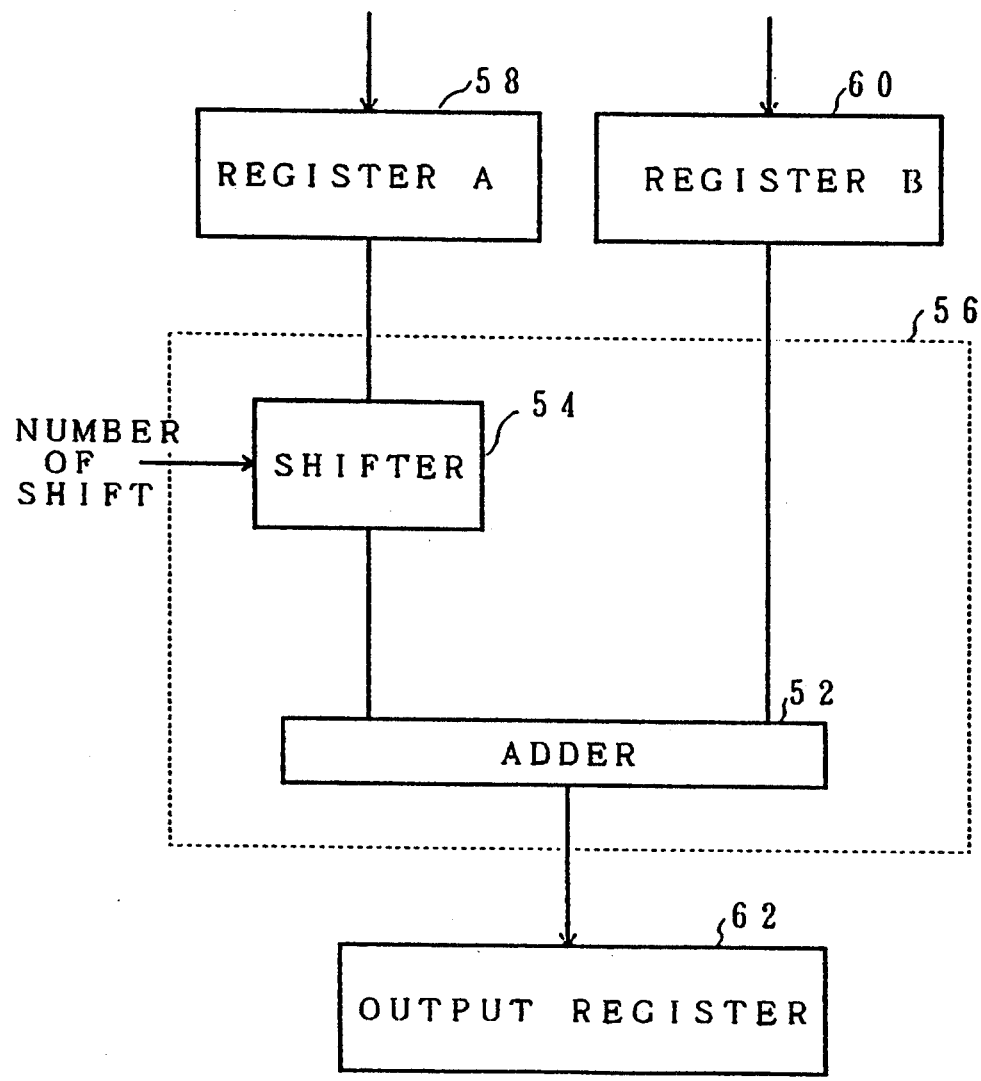
FIG. 30 shows a block diagram of a configuration of an ALU for use in a filter operation according to the embodiment of the present invention.

The ALU 56 shown in FIG. 30 shifts the value set in register A in accordance with the predetermined number of shifting operations is shifted by shifter 54 and the value set in the register B is added by the adder 52, the result being outputted to the output register 62. The ALU is also used by other processes such as a process performed by echo-canceler 22. When 3 input adders should be used as an ALU for performing other processes, it is clear that a multiplication by $-0.875$ can be performed by one operation and thus a filter function with a value of a of 4.33333 for example can be used.

$$H(z^{-1}) = -0.1875 + z^{-1} - 0.8125z^{-2} \quad (16)$$
$$= -(0.125 + 0.0625) + z^{-1} - (1 - 0.125 - 0.0625)z^{-2}$$

The transfer function expressed by the equation (16) may be used although the number of processes may increase to some extent.

$$\begin{aligned}H(z^{-1}) &= -1/9 + z^{-1} - 8/9\, z^{-2} \quad (17)\\ &= -1 + 9z^{-1} - 8z^{-2}\\ H(z^{-1}) &= -0.125 + 1.125\, z^{-1} - z^{-2}\end{aligned}$$

It is clear that the equation (17) represents a pulse shaping high-pass filter in which the volume of operation processes is the same as that expressed by the equation (14).

By applying this embodiment to the digital subscriber line transmission interface apparatus, the output period of the decimation filter may correspond to the symbol frequency and thus the scale of the circuit of the decimation filter may be decreased. And it is not necessary to provide a pulse shaping function to the decimation filter and a circuit for generating the tap coefficient of the decimation filter can be formed with a simple random logic circuit and thus the power consumption can be greatly decreased as compared with the previous embodiment in which the tap coefficient are produced using ROM.

What is claimed is:

1. A transversal filter for use in a receiving part of a digital subscriber line interface device comprising:
   a decimation filter means for eliminating noise from a received signal by converting a frequency of the received signal, a pulse shaping filter means having tap coefficients corresponding to a transfer function in which at least one 0 point is provided outside a unit circle in the z plane and having an impulse response having a ringing characteristic in which the inverted polarity of the main response is added to the main response;
   a high-pass filter means for receiving the output of said pulse shaping filter means and for passing a high frequency signal; and
   means for providing said decimation filter means with properties of said pulse shaping filter means and said high-pass filter means.

2. The transversal filter according to claim 1 wherein said decimation filter means and pulse shaping filter means comprise in combination:
   a transversal decimation filter in an oversampling A/D converter for receiving a signal comprising a small number of bits at a speed of n times a basic sampling frequency, removing high frequency noise components, generating a waveform, eliminating unnecessary components, and outputting a signal at a speed of the basic sampling frequency, wherein
   a coefficient of each transversal tap is determined such that one or two zero points associated with the characteristic of pass areas are located near the point where Z=1 on the z plane, and that at least one of said zero points of a transfer function is positioned outside a unit circle of the z plane, and an impulse response characteristic is featured by a wave formed with a polarity reversed to a main response before the issue of said main response.

3. The transversal filter according to claim 2, wherein a tap coefficient is set such that the impulse of a second precursor of an isolated pulse response characteristic is set to zero with the amplitude of an impulse response set to a characteristic value that is the reverse of a value less than the maximum, and set to a characteristic value having the polarity the same as that of the second latest maximum value.

4. The transversal filter according to claim 3, wherein two zero points mainly associated with the characteristics of pass areas and positioned not on said circumference of said unit circle are located outside said unit circle.

5. The transversal filter according to claim 2, wherein two zero points associated with block areas in said transfer function are positioned at equal intervals on the unit circumference of said z plane.

6. The transversal filter according to claim 2, wherein two zero points associated with the characteristics of pass areas and located not on the circumference of a unit circle are positioned inside and outside said unit circle, respectively, to form a mirror image correlation with each other, centering said unit circle.

7. The transversal filter according to claim 2, wherein one zero point associated mainly with the characteristics of pass areas and positioned not on said circumference of said unit circle is located outside said unit circle.

8. A transversal filter according to claim 1 wherein said pulse shaping filter means comprises
   a pulse shaping filter wherein it has an isolated pulse response in which the polarity of the input signal is inverted near the time preceding the maximum value of that response waveform by period T when the isolated pulse response is considered up to an input of an inter-symbol interference compensator provided in a receiving side of the transmission line for transmitting a multi-value level signal at a predetermined symbol period T and the transfer function H(z) by the z conversion is expressed as follows, $$H(z) = 1 - az^{-1}, \text{ where } a > 1.$$

9. The transversal filter according to claim 8 wherein said high-pass filter means includes a high-pass filter for processing the output of said pulse shaping filter.

10. The transversal filter according to claim 8 in which all the tap coefficients of the transversal filter can be expressed as powers of 2 or the sum or difference of two powers of 2.

11. The transversal filter according to claim 1 wherein said pulse shaping filter means and high-pass filter means comprise in combination:
   a waveform shaping high-pass filter comprising means for inverting the polarity of an input signal at a time preceding the time of the maximum value of the waveform of an isolated response pulse by period T when an isolated pulse waveform is considered up to an input of an inter-signal interference compensator provided at a receiving side of the transmission line for transmitting a multi-value level signal at a predetermined symbol period T; and a means for passing only a high frequency component of the output from the high-pass filter, wherein the transfer function H(z) expressed by the z conversion is as follows:

$$H(z) = 1/(1+a) + z^{-1} - a/(1a) \cdot z^{-2}$$

where $a > 1$.

12. The transversal filter according to claims 11 wherein all the tap coefficients of the transversal filter can be expressed as powers of 2 or the sum or difference of two powers of 2.

13. The transversal filter according to claim 11 wherein the transfer function H(z) of the transversal filter is as follows:

$$H(z) = -0.125 - z^{-1} - 0.375 z^{-2}.$$

14. The transversal filter according to claim 11 in which the transfer function H(z) of the transversal filter is as follows:

$$H(z) = -0.125 + 1.125 z^{-1} - z^{-2}.$$

15. A pulse shaping filter comprising means for inverting the polarity of an input signal near the time preceding the maximum value of the waveform of an isolated response pulse by period T when the isolated response pulse is considered up to an input of an inter-signal interference compensator provided in a receiving side of a transmission line for transmitting a multi-value level signal at a predetermined symbol period T and wherein the transfer function H(z) by the z conversion is expressed as follows:

$$H(z) = 1 - az^{-1}, \text{ where } a > 1.$$

16. The filter according to claim 15 further comprising a high-pass filter for processing the output of said pulse shaping filter.

17. The filter according to claim 15 in which all the tap coefficients of the transversal filter can be expressed as powers of 2 or the sum or difference of two powers of 2.

* * * * *